(12) United States Patent
Cha et al.

(10) Patent No.: US 10,991,783 B2
(45) Date of Patent: Apr. 27, 2021

(54) SCAN DRIVER AND DISPLAY DEVICE INCLUDING THE SAME

(71) Applicant: Samsung Display Co., Ltd., Yongin-si (KR)

(72) Inventors: Myounggeun Cha, Seoul (KR); Sanggun Choi, Suwon-si (KR); Jiyeong Shin, Suwon-si (KR); Yongsu Lee, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/573,882

(22) Filed: Sep. 17, 2019

(65) Prior Publication Data

US 2020/0135825 A1    Apr. 30, 2020

(30) Foreign Application Priority Data

Oct. 26, 2018  (KR) .......................... 10-2018-0128834

(51) Int. Cl.
*H01L 27/32* (2006.01)
*G09G 3/3258* (2016.01)
(Continued)

(52) U.S. Cl.
CPC ....... *H01L 27/3262* (2013.01); *G09G 3/3258* (2013.01); *G09G 3/3266* (2013.01);
(Continued)

(58) Field of Classification Search
CPC .............. G09G 3/3258; G09G 3/3266; G09G 2300/0426; G09G 2310/08;
(Continued)

(56) References Cited

U.S. PATENT DOCUMENTS 9,530,800 B2  12/2016  Wang et al.
10,140,039 B1  11/2018  Baruch et al.
(Continued)

FOREIGN PATENT DOCUMENTS

| JP | 2742747 B2 | 4/1998 |
|----|-----------|--------|
| JP | 5366517 B2 | 12/2013 |
| JP | 5960000 B2 | 8/2016 |

OTHER PUBLICATIONS

EPO Partial Search Report dated Feb. 25, 2020, for corresponding European Patent Application No. 19205489.8 (31 pages).

*Primary Examiner* — Michael Pervan
(74) *Attorney, Agent, or Firm* — Lewis Roca Rothgerber Christie LLP

(57) ABSTRACT

A scan driver includes a substrate, a first transistor on the substrate, the first transistor including a first active pattern and a first gate electrode, the first active pattern including first and second regions, and a first channel region between the first and second regions, a second transistor on the first transistor, the second transistor including a second active pattern and a second gate electrode, the second active pattern including third and fourth regions, and a second channel region between the third and fourth regions, first and second electrodes on the second transistor, the first electrode and the second electrode electrically connected to the first region and the second region, respectively, and third and fourth electrodes on the second transistor, the third electrode and the fourth electrode electrically connected to the third region and the fourth region, respectively, wherein the first and third electrodes are electrically connected.

32 Claims, 14 Drawing Sheets

(51) Int. Cl.
*G09G 3/3266* (2016.01)
*H01L 27/12* (2006.01)

(52) U.S. Cl.
CPC ...... *H01L 27/3265* (2013.01); *H01L 27/3272* (2013.01); *G09G 2300/0426* (2013.01); *G09G 2310/08* (2013.01); *H01L 27/1214* (2013.01)

(58) Field of Classification Search
CPC ............ H01L 27/3262; H01L 27/3265; H01L 27/3272; H01L 27/1214
See application file for complete search history.

(56) References Cited

U.S. PATENT DOCUMENTS

| | | |
|---|---|---|
| 2016/0149573 A1 | 5/2016 | Maehashi et al. |
| 2016/0358573 A1 | 12/2016 | Takeuchi et al. |
| 2017/0032733 A1 | 2/2017 | Jang |
| 2017/0317156 A1 | 11/2017 | Kim et al. |
| 2018/0019343 A1 | 1/2018 | Asami |

# SCAN DRIVER AND DISPLAY DEVICE INCLUDING THE SAME

CROSS-REFERENCE TO RELATED APPLICATION

This application claims priority to, and the benefit of, Korean Patent Application No. 10-2018-0128834, filed on Oct. 26, 2018 in the Korean Intellectual Property Office (KIPO), the entire disclosure of which is incorporated by reference herein.

BACKGROUND

1. Field

Embodiments of the present disclosure relate to a scan driver, and a display device including the scan driver.

2. Description of the Related Art

Recently, various flat panel display devices that have weight and size advantages over conventional display devices, such as Cathode Ray Tubes (CRTs), have been developed. Examples of the flat panel display devices include liquid crystal display (LCD) devices, field emission display (FED) devices, plasma display panels (PDPs), and organic light emitting display (OLED) devices.

Because the OLED device uses organic light emitting diodes that emit light based on recombination of electrons and holes, the OLED device has advantages such as a rapid response and low power consumption.

SUMMARY

Embodiments of the present disclosure provide a scan driver occupying a small area, and also provide a display device having a reduced dead space.

A scan driver according to embodiments may include a substrate, a first transistor on the substrate, the first transistor including a first active pattern and a first gate electrode, the first active pattern including a first region, a second region, and a first channel region between the first region and the second region, a second transistor on the first transistor, the second transistor including a second active pattern and a second gate electrode, the second active pattern including a third region, a fourth region, and a second channel region between the third region and the fourth region, a first electrode and a second electrode on the second transistor, the first electrode and the second electrode electrically connected to the first region and the second region, respectively, and a third electrode and a fourth electrode on the second transistor, the third electrode and the fourth electrode electrically connected to the third region and the fourth region, respectively, wherein the first electrode is electrically connected to the third electrode.

The first active pattern may include a first overlapping portion, a first protruding portion protruding from the first overlapping portion in a first direction and being connected to the first electrode, and a second protruding portion protruding from the first overlapping portion in a second direction and being connected to the second electrode.

The second active pattern may include a second overlapping portion overlapping the first overlapping portion, a third protruding portion protruding from the second overlapping portion in the first direction and being connected to the third electrode, and a fourth protruding portion protruding from the second overlapping portion in the second direction and being connected to the fourth electrode.

The third protruding portion might not overlap the first protruding portion, and the fourth protruding portion might not overlap the second protruding portion.

The second direction may be opposite to the first direction.

The second electrode may be electrically connected to the fourth electrode.

The second gate electrode may overlap the first gate electrode.

The scan driver may further include a shielding electrode between the first transistor and the second transistor.

A width of the shielding electrode may be greater than a width of the first gate electrode.

A voltage for controlling a driving range of the second transistor may be applied to the shielding electrode.

The driving range of the second transistor may become wide when a negative voltage is applied to the shielding electrode, and may become narrow when a positive voltage is applied to the shielding electrode.

The scan driver may further include a plurality of stages for outputting a plurality of scan signals, respectively, wherein each of the plurality of stages includes a first input part for transmitting an input signal to a set node in response to a second clock signal, a second input part for transmitting a first clock signal to a reset node in response to the input signal and the second clock signal, a first output part for outputting a third clock signal as the scan signal in response to a voltage of the set node, and a second output part for outputting a concurrent driving signal as the scan signal in response to a voltage of the reset node.

The plurality of stages may include a first stage including the first transistor, and a second stage including the second transistor.

The first output part of the first stage may include the first transistor, and the first output part of the second stage includes the second transistor.

The second output part of the first stage may include the first transistor, and the second output part of the second stage may include the second transistor.

The first output part may include the first transistor, and the second output part includes the second transistor.

A scan driver according to embodiments may include a substrate, a first active pattern on the substrate, the first active pattern including a first region, a second region, and a first channel region between the first region and the second region, a first gate electrode on the first active pattern, a second active pattern on the first gate electrode, the second active pattern including a third region, a fourth region, and a second channel region between the third region and the fourth region, a second gate electrode on the second active pattern, a first electrode and a second electrode on the second gate electrode, the first electrode and the second electrode being electrically connected to the first region and the second region, respectively, and a third electrode and a fourth electrode on a same layer as the first electrode and the second electrode, the third electrode and the fourth electrode being electrically connected to the third region and the fourth region, respectively, wherein the first electrode is integrally formed with the third electrode.

The second electrode may be integrally formed with the fourth electrode.

The first active pattern may include a first overlapping portion, a first protruding portion protruding from the first overlapping portion in a first direction and being connected to the first electrode, and a second protruding portion protruding from the first overlapping portion in a second direction and being connected to the second electrode.

The second active pattern may include a second overlapping portion overlapping the first overlapping portion, a third protruding portion protruding from the second overlapping portion in the first direction and being connected to the third electrode, and a fourth protruding portion protruding from the second overlapping portion in the second direction and being connected to the fourth electrode.

The third protruding portion might not overlap the first protruding portion, and the fourth protruding portion might not overlap the second protruding portion.

The second gate electrode may overlap the first gate electrode.

The scan driver my further include a shielding electrode between the first gate electrode and the second active pattern.

A width of the shielding electrode may be greater than a width of the first gate electrode.

A display device according to embodiments may include a display unit including a driving transistor including a driving active pattern and a driving gate electrode, and a switching transistor on the driving transistor, the switching transistor including a switching active pattern and a switching gate electrode, and a scan driver for supplying a scan signal to the display unit, and including a first transistor including a first active pattern and a first gate electrode, the first active pattern including a first region, a second region, and a first channel region between the first region and the second region, and a second transistor on the first transistor, the second transistor including a second active pattern and a second gate electrode, the second active pattern including a third region, a fourth region, and a second channel region between the third region and the fourth region.

The first active pattern and the first gate electrode of the first transistor may be respectively on a same layer as the driving active pattern and the driving gate electrode of the driving transistor.

The second active pattern and the second gate electrode of the second transistor may be respectively on a same layer as the switching active pattern and the switching gate electrode of the switching transistor.

The display unit may further include a storage capacitor including a first storage electrode integrally formed with the driving gate electrode, and a second storage electrode between the driving transistor and the switching transistor, and the scan driver may further include a shielding electrode between the first transistor and the second transistor.

The shielding electrode may be on a same layer as the second storage electrode.

The display unit may further include a program capacitor including a first program electrode on the switching transistor, and a second program electrode on the first program electrode, and the scan driver may further include a first electrode, a second electrode, a third electrode, and a fourth electrode on the second transistor, the first electrode, the second electrode, the third electrode, and the fourth electrode being electrically connected to the first region, the second region, the third region, and the fourth region, respectively.

The first electrode, the second electrode, the third electrode, and the fourth electrode may be on a same layer as one of the first program electrode and the second program electrode.

The display device may further include a pixel electrode electrically connected to the second program electrode, an organic light emitting layer on the pixel electrode, and a common electrode on the organic light emitting layer.

The scan driver according to some of the embodiments may include the first transistor and the second transistor overlapping each other, and electrically connected to each other through electrodes located thereon. Accordingly, the scan driver may occupy a small area.

The display device according to some of the embodiments may include the scan driver including the first transistor and the second transistor overlapping each other and the display unit including the driving transistor and the switching transistor overlapping each other. Accordingly, a high-definition display device may be realized, and a dead space of the display device may be reduced.

BRIEF DESCRIPTION OF THE DRAWINGS

Illustrative, non-limiting embodiments will be more clearly understood from the following detailed description taken in conjunction with the accompanying drawings.

DETAILED DESCRIPTION

Figure 1:
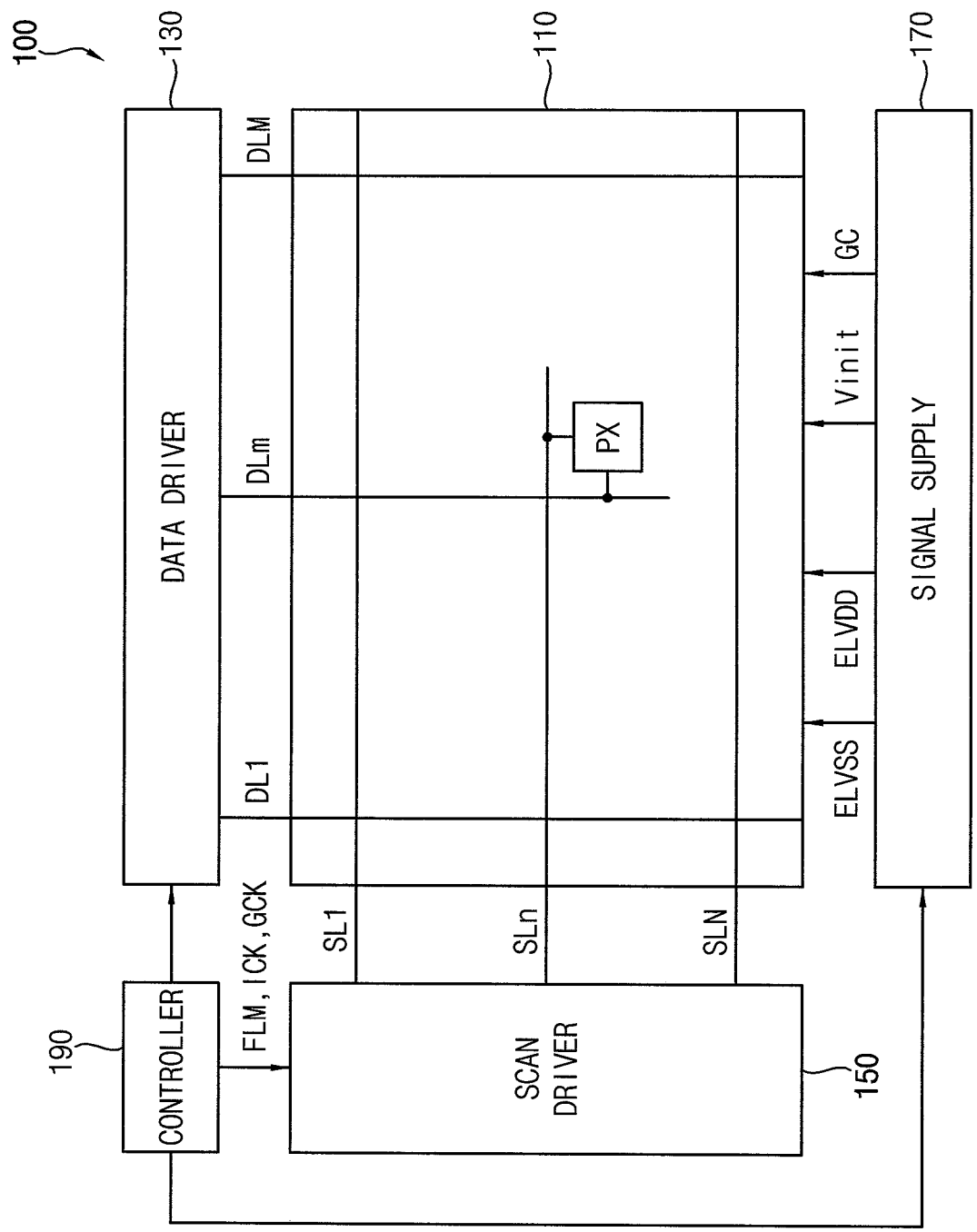
FIG. 1 is a block diagram illustrating a display device according to an embodiment.

Features of the inventive concept and methods of accomplishing the same may be understood more readily by reference to the detailed description of embodiments and the accompanying drawings. Hereinafter, embodiments will be described in more detail with reference to the accompanying drawings. The described embodiments, however, may be embodied in various different forms, and should not be construed as being limited to only the illustrated embodiments herein. Rather, these embodiments are provided as examples so that this disclosure will be thorough and complete, and will fully convey the aspects and features of the present inventive concept to those skilled in the art. Accordingly, processes, elements, and techniques that are not necessary to those having ordinary skill in the art for a complete understanding of the aspects and features of the present inventive concept may not be described. Unless otherwise noted, like reference numerals denote like elements throughout the attached drawings and the written description, and thus, descriptions thereof will not be repeated. Further, parts not related to the description of the embodiments might not be shown to make the description clear. In the drawings, the relative sizes of elements, layers, and regions may be exaggerated for clarity.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting. Additionally, as those skilled in the art would realize, the described embodiments may be modified in various different ways, all without departing from the spirit or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

It will be understood that when an element, layer, region, or component is referred to as being "on," "connected to," or "coupled to" another element, layer, region, or component, it can be directly on, connected to, or coupled to the other element, layer, region, or component, or one or more intervening elements, layers, regions, or components may be present. However, "directly connected/directly coupled" refers to one component directly connecting or coupling another component without an intermediate component. Meanwhile, other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

For the purposes of this disclosure, expressions such as "at least one of," when preceding a list of elements, modify the entire list of elements and do not modify the individual elements of the list. For example, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

When a certain embodiment may be implemented differently, a specific process order may be performed differently from the described order. For example, two consecutively described processes may be performed substantially at the same time or performed in an order opposite to the described order.

The electronic or electric devices and/or any other relevant devices or components according to embodiments of the present disclosure described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the embodiments of the present disclosure.

Unless otherwise defined, all terms (including technical and scientific terms) used herein have the same meaning as commonly understood by one of ordinary skill in the art to which the present inventive concept belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a block diagram illustrating a display device according to an embodiment.

Referring to FIG. 1, a display device 100 may include a display unit 110, a data driver 130 providing data signals to the display unit 110, a scan driver 150 providing scan signals to the display unit 110, and a signal supply 170 providing signals to the display unit 110. In an embodiment, the display device 100 may further include a controller (e.g., a timing controller) 190 controlling the data driver 130, the scan driver 150, and the signal supply 170.

The display unit 110 may include a plurality of data lines DL1, . . . , DLm, . . . , DLM, a plurality of scan lines SL1, . . . , SLn, . . . , SLN, and a plurality of pixels PX connected to the data lines DL1, . . . , DLm, . . . , DLM and the scan lines SL1, . . . , SLn, . . . , SLN. In an embodiment, the display device 100 may be an organic light emitting display device in which each pixel PX includes an organic light emitting diode, but is not limited thereto. For example, the display device 100 may be a liquid crystal display (LCD) device, or the like.

Figure 2:
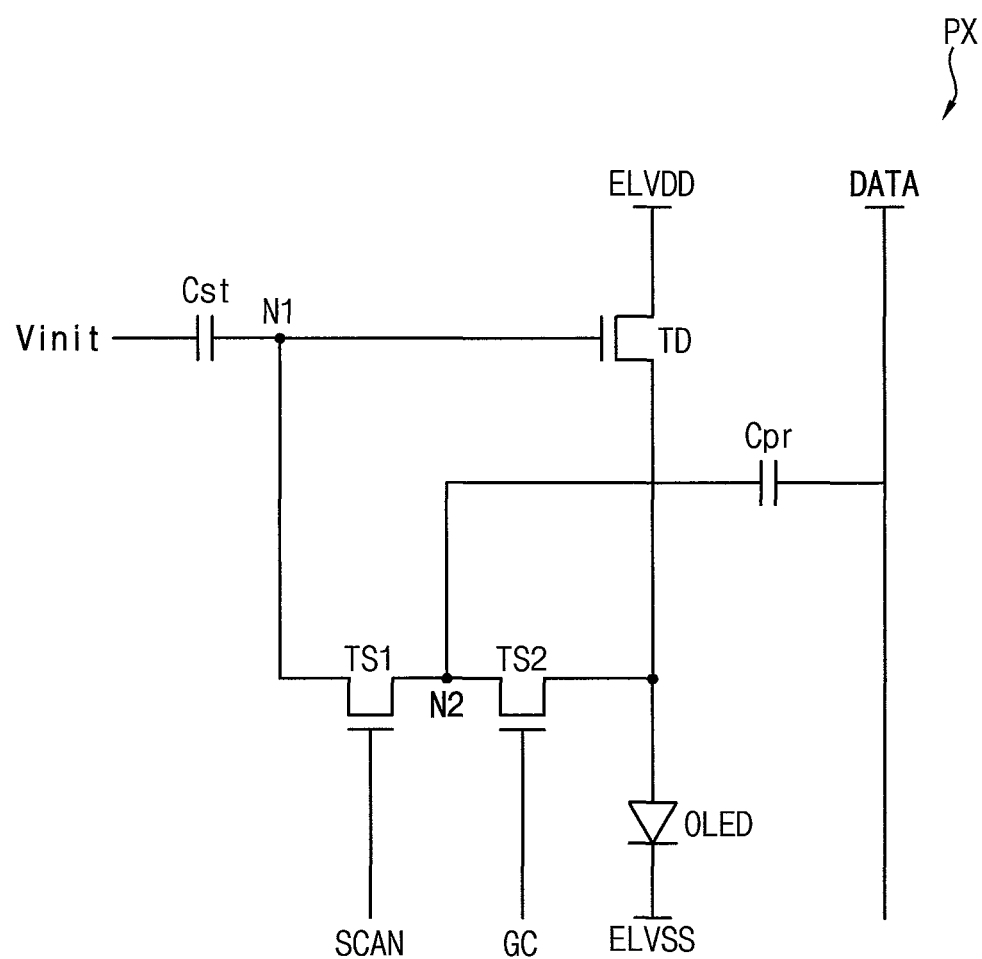
FIG. 2 is a circuit diagram illustrating an example of a pixel included in the display device in FIG. 1.

FIG. 2 is a circuit diagram illustrating an example of the pixel PX included in the display device 100 in FIG. 1.

Referring to FIG. 2, in an embodiment, each pixel PX may have a 3T2C structure including three transistors TD, TS1, and TS2 and two capacitors Cst and Cpr. For example, each pixel PX may include a driving transistor TD, a first switching transistor TS1, a second switching transistor TS2, a storage capacitor Cst, a program capacitor Cpr, and an organic light emitting diode OLED.

The storage capacitor Cst may have a first electrode receiving a first driving signal Vinit and a second electrode connected to a first node N1.

The driving transistor TD may have a gate connected to the first node N1, a source receiving a first power supply signal ELVDD, and a drain connected to the organic light emitting diode OLED.

The first switching transistor TS1 may have a gate receiving a scan signal SCAN, a source connected to a second node N2, and a drain connected to the first node N1.

The second switching transistor TS2 may have a gate receiving a second driving signal GC, a source connected to the second node N2, and a drain connected to the drain of the driving transistor TD.

The program capacitor Cpr may have a first electrode receiving a data signal DATA and a second electrode connected to the second node N2.

The organic light emitting diode OLED may have an anode connected to the drain of the driving transistor TD and a cathode receiving a second power supply signal ELVSS.

Although FIG. 2 illustrates an example of the pixel PX having the 3T2C structure, a structure of the pixel PX of the display device 100 according to an embodiment is not limited to the 3T2C structure. For example, the pixel PX may have another 3T2C structure having connections different from those of the example of FIG. 2, or may have any structure including two or more transistors and one or more capacitors.

In an embodiment, the display device 100 may be driven in a concurrent (e.g., simultaneous or substantially simultaneous) driving manner in which each frame includes a concurrent compensation period, a data programming period, and a concurrent emission period.

In the concurrent compensation period, the plurality of pixels PX may concurrently (or simultaneously) perform threshold voltage compensation operations. For example, in the concurrent compensation period, the plurality of scan signals SCAN and the second driving signal GC may be applied to the plurality of pixels PX, the first and second switching transistors TS1 and TS2 of the plurality of pixels PX may be turned on in response to the plurality of scan signals SCAN and the second driving signal GC, and the driving transistors TD of the plurality of pixels PX may be diode-connected by the turned-on first and second switching transistors TS1 and TS2 to store threshold voltages of the driving transistors TD in the storage capacitors Cst.

In the data programming period, the data signals DATA are sequentially written to the plurality of pixels PX on a row-by-row basis. For example, in the data programming period, the plurality of scan signals SCAN may be sequentially applied to the plurality of pixels PX on the row-by-row basis, the first switching transistor TS1 of each pixel PX may be turned on in response to the scan signal SCAN, and the data signal DATA may be stored through charge sharing between the program capacitor Cpr and the storage capacitor Cst in each pixel PX. Because the threshold voltage has been stored in the storage capacitor Cst of each pixel PX in the concurrent compensation period, the data signal DATA in which the threshold voltage is compensated may be stored in the storage capacitor Cst in the data programming period.

In the concurrent emission period, the plurality of pixels PX may concurrently (or simultaneously) emit light. For example, in the concurrent emission period, the driving transistors TD of the plurality of pixels PX may generate driving currents based on the data signals DATA in which the threshold voltage is compensated and stored in the storage capacitors Cst, and the organic light emitting diodes OLED of the plurality of pixels PX may concurrently (or simultaneously) emit light based on the driving currents.

Figure 3:
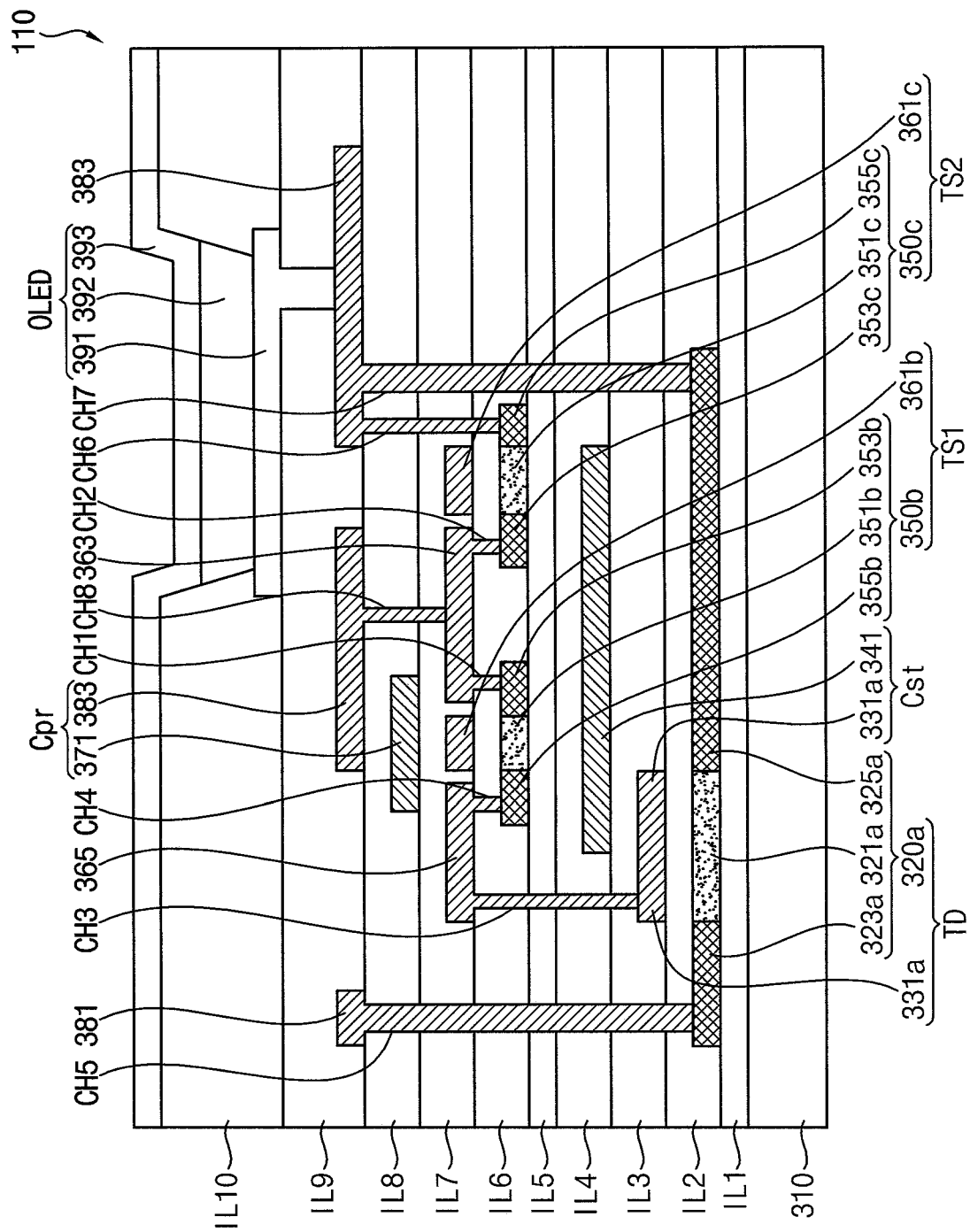
FIG. 3 is a cross-sectional view illustrating an example of a display unit included in the display device in FIG. 1.

FIG. 3 is a cross-sectional view illustrating an example of the display unit 110 included in the display device 100 in FIG. 1. For example, FIG. 3 may illustrate an example of the pixel PX shown in FIG. 2

Referring to FIG. 3, the driving transistor TD, the first switching transistor TS1, the second switching transistor TS2, the storage capacitor Cst, the program capacitor Cpr, and the organic light emitting diode OLED may be located on a substrate 310 in the display unit 110.

A first insulation layer IL1 may be formed on the substrate 310. The substrate 310 may be an insulating substrate including one or more of glass, crystal, ceramic, plastic, etc. The first insulation layer IL1 may block impurities from the substrate 310 during a crystallization process for forming polysilicon to serve to improve characteristics of the polysilicon, and may provide a planarized surface on the first insulation layer IL1.

A first active layer 320a including a driving active pattern 320a may be formed on the first insulation layer IL1. The driving active pattern 320a may include a driving channel region 321a, and a driving source region 323a and a driving drain region 325a formed with the driving channel region 321a in between.

A second insulation layer IL2 covering the driving active pattern 320a may be formed thereon. A first conductive layer 331a including a driving gate electrode 331a may be formed on the second insulation layer IL2. The driving gate electrode 331a may overlap the driving channel region 321a. The driving gate electrode 331a may form the driving transistor TD together with the driving active pattern 320a.

A third insulation layer IL3 covering the driving gate electrode 331a may be formed thereon. A second conductive layer 341 including a second storage electrode 341 may be formed on the third insulation layer IL3. The second storage electrode 341 may be wider than a first storage electrode 331a that functions as the driving gate electrode. The second storage electrode 341 may form the storage capacitor Cst together with the first storage electrode 331a.

A fourth insulation layer IL4 covering the second storage electrode 341 may be formed thereon. A fifth insulation layer IL5 may be formed on the fourth insulation layer IL4. The fifth insulation layer IL5 may block impurities during a crystallization process for forming polysilicon to serve to improve characteristics of the polysilicon, and may provide a planarized surface on the fifth insulation layer IL5.

A second active layer 350b and 350c including a first switching active pattern 350b and a second switching active pattern 350c may be formed on the fifth insulation layer IL5. The first switching active pattern 350b may include a first switching channel region 351b, and a first switching source region 353b and a first switching drain region 355b formed with the first switching channel region 351b therebetween. The second switching active pattern 350c may include a second switching channel region 351c, and a second switching source region 353c and a second switching drain region 355c formed with the second switching channel region 351c in between.

The driving active pattern 320a and the second active layer 350b and 350c may be formed of polysilicon or an oxide semiconductor. The oxide semiconductor may include oxides based on titanium (Ti), hafnium (Hf), zirconium (Zr), aluminum (Al), tantalum (Ta), germanium (Ge), zinc (Zn), gallium (Ga), tin (Sn), or indium (In).

A sixth insulation layer IL6 covering the second active layer 350b and 350c may be formed thereon. Contact holes CH1, CH2, CH3, and CH4 may be formed in the sixth insulation layer IL6. A third conductive layer 361b, 361c, 363, and 365 including a first switching gate electrode 361b, a second switching gate electrode 361c, a first connecting pattern 363, and a second connecting pattern 365 may be formed on the sixth insulation layer IL6.

The first switching gate electrode 361b and the second switching gate electrode 361c may overlap the first switching channel region 351b and the second switching channel region 351c, respectively. The first switching gate electrode 361b may form the first switching transistor TS1 together with the first switching active pattern 350b. The second switching gate electrode 361c may form the second switching transistor TS2 together with the second switching active pattern 350c. The first connecting pattern 363 may be connected to the first switching source region 353b through a first contact hole CH1 formed in the sixth insulation layer IL6, and may be connected to the second switching source region 353c through a second contact hole CH2 formed in the sixth insulation layer IL6. The second connecting pattern 365 may be connected to the driving gate electrode 331a through a third contact hole CH3 formed in the third, fourth, fifth, and sixth insulation layers IL3, IL4, IL5, and IL6, and may be connected to the first switching drain region 355b through a fourth contact hole CH4 formed in the sixth insulation layer IL6.

The driving gate electrode 331a, the second storage electrode 341, and the third conductive layer 361b, 361c, 363, and 365 may be formed of copper (Cu), a copper alloy, aluminum (Al), an aluminum alloy, molybdenum (Mo), and/or a molybdenum alloy.

The first switching transistor TS1 and/or the second switching transistor TS2 may overlap the driving transistor TD. In an embodiment, both the first switching transistor TS1 and the second switching transistor TS2 may overlap the driving transistor TD. However, the present embodiment is not limited thereto, and only one of the first switching transistor TS1 and the second switching transistor TS2 may overlap the driving transistor TD in other embodiments.

A seventh insulation layer IL7 covering the third conductive layer 361b, 361c, 363, 365 may be formed thereon. A fourth conductive layer 371 including a data line 371 may be formed on the seventh insulation layer IL7.

An eighth insulation layer IL8 covering the data line 371 may be formed thereon. Contact holes CH5, CH6, CH7, and CH8 may be formed in the eighth insulation layer IL8. A fifth conductive layer 381 and 383 including a first power supply signal line 381 and a second program electrode 383 may be formed on the eighth insulation layer IL8.

The first power supply signal line 381 may be connected to the driving source region 323a through a fifth contact hole CH5 formed in the second, third, fourth, fifth, sixth, seventh, and eighth insulation layers IL2, IL3, IL4, IL5, IL6, IL7, and IL8. The second program electrode 383 may overlap a first program electrode 371 that functions as the data line. The second program electrode 383 may form the program capacitor Cpr together with the first program electrode 371. The second program electrode 383 may be connected to the second switching drain region 355c through a sixth contact hole CH6 formed in the sixth, seventh, and eighth insulation layers IL6, IL7, and IL8, may be connected to the driving drain region 325a through a seventh contact hole CH7 formed in the second, third, fourth, fifth, sixth, seventh, and eighth insulation layers IL2, IL3, IL4, IL5, IL6, IL7, and IL8, and may be connected to the first connecting pattern 363 through a eighth contact hole CH8 formed in the seventh and eighth insulation layers IL7 and IL8.

The first insulation layer IL1, the second insulation layer IL2, the third insulation layer IL3, the fourth insulation layer IL4, the fifth insulation layer IL5, the sixth insulation layer IL6, the seventh insulation layer IL7, and the eighth insulation layer IL8 may be formed of silicon nitride, silicon oxide, etc. The data line 371 and the fifth conductive layer 381 and 383 may be formed of copper (Cu), a copper alloy, aluminum (Al), an aluminum alloy, molybdenum (Mo), and/or a molybdenum alloy. For example, the data line 371 and the fifth conductive layer 381 and 383 may be formed of a triple layer of titanium/aluminum/titanium (Ti/Al/Ti), a triple layer of molybdenum/aluminum/molybdenum (Mo/Al/Mo), or a triple layer of molybdenum/copper/molybdenum (Mo/Cu/Mo).

A ninth insulation layer IL9 covering the fifth conductive layer 381 and 383 may be formed thereon. The ninth insulation layer IL9 may cover the fifth conductive layer 381 and 383 to planarize thereon. The ninth insulation layer IL9 may be formed of a stacked layer of an organic material such as a polyacrylate resin, a polyimide resin, or the like, or a stacked layer of an organic material and an inorganic material.

A pixel electrode 391 may be formed on the ninth insulation layer IL9. The pixel electrode 391 may be connected to the second program electrode 383 through a contact hole formed in the ninth insulation layer IL9.

A tenth insulation layer IL10 covering an edge of the pixel electrode 391 may be formed thereon. The tenth insulation layer IL10 may have an opening exposing the pixel electrode 391. The tenth insulation layer IL10 may be formed of organic materials such as a polyacrylate resin, a polyimide resin, and the like, or silica-based inorganic materials.

An organic light emitting layer 392 may be formed on the pixel electrode 391 exposed by the opening, and the common electrode 393 may be formed on the organic light emitting layer 392. The common electrode 393 may be also formed on the tenth insulation layer IL10, and may be formed throughout a plurality of pixels PX. The organic light emitting layer 392 and the common electrode 393 may form the organic light emitting diode OLED together with the pixel electrode 391.

In an embodiment, the pixel electrode 391 may be an anode of the organic light emitting diode OLED, and the common electrode 393 may be a cathode of the organic light emitting diode OLED. However, the present embodiment is not limited thereto, and the pixel electrode 391 may be the cathode of the organic light emitting diode OLED, and the common electrode 393 may be the anode of the organic light emitting diode OLED in other embodiments depending on a driving method. When holes and electrons are injected into the organic light emitting layer 392 from the pixel electrode 391 and the common electrode 393, respectively, and excitons acquired by combining the injected holes and electrons fall from an excitation state to a ground state, light may be emitted.

The organic light emitting layer 392 may be formed of a low-molecular organic material or a high-molecular organic material such as poly(3,4-ethylenedioxythiophene) (PEDOT). The organic light emitting layer 392 may be formed with multiple layers including at least one of an emission layer, a hole injection layer (HIL), a hole transporting layer (HTL), an electron transporting layer (ETL), and an electron injection layer (EIL).

As shown in FIG. 3, the driving active pattern 320a and the second active layer 350b and 350c located in different layers from each other may be formed in the display unit 110. Therefore, the transistors TD, TS1, and TS2 included in the pixel PX may overlap with each other. Accordingly, an area occupied by the transistors TD, TS1, and TS2 may decrease, an area of the pixel PX may decrease, and the display device 100 with a high resolution in which the display unit 110 includes more pixels PX in a unit area may be realized.

Referring to FIG. 1 again, the data driver 130 may output the data signals DATA to the data lines DL1, . . . , DLm, . . . , DLM based on a data control signal and image data from the controller 190. In an embodiment, the data driver 130 may provide the data signals DATA to the plurality of pixels PX through the data lines DL1, . . . , DLm, . . . , DLM in the data programming period.

The scan driver 150 may output the scan signals SCAN to the scan lines SL1, . . . , SLn, . . . , SLN based on a gate control signal from the controller 190. In an embodiment, the gate control signal may include a start signal FLM, an input clock signal ICK, and a concurrent driving signal GCK. In an embodiment, the scan driver 150 may concurrently (or simultaneously) provide the scan signals SCAN to the plurality of pixels PX through the scan lines SL1, . . . , SLn, . . . , SLN in response to the concurrent driving signal GCK in the concurrent compensation period, and may sequentially provide the scan signals SCAN to the plurality of pixels PX through the scan lines SL1, . . . , SLn, . . . , SLN on a row-by-row basis in response to the start signal FLM and the input clock signal ICK in the data programming period.

The signal supply 170 may supply the first power supply signal ELVDD, the second power supply signal ELVSS, the first driving signal Vinit, and the second driving signal GC to the display unit 110 based on a signal supply control signal from the controller 190.

Figure 4:
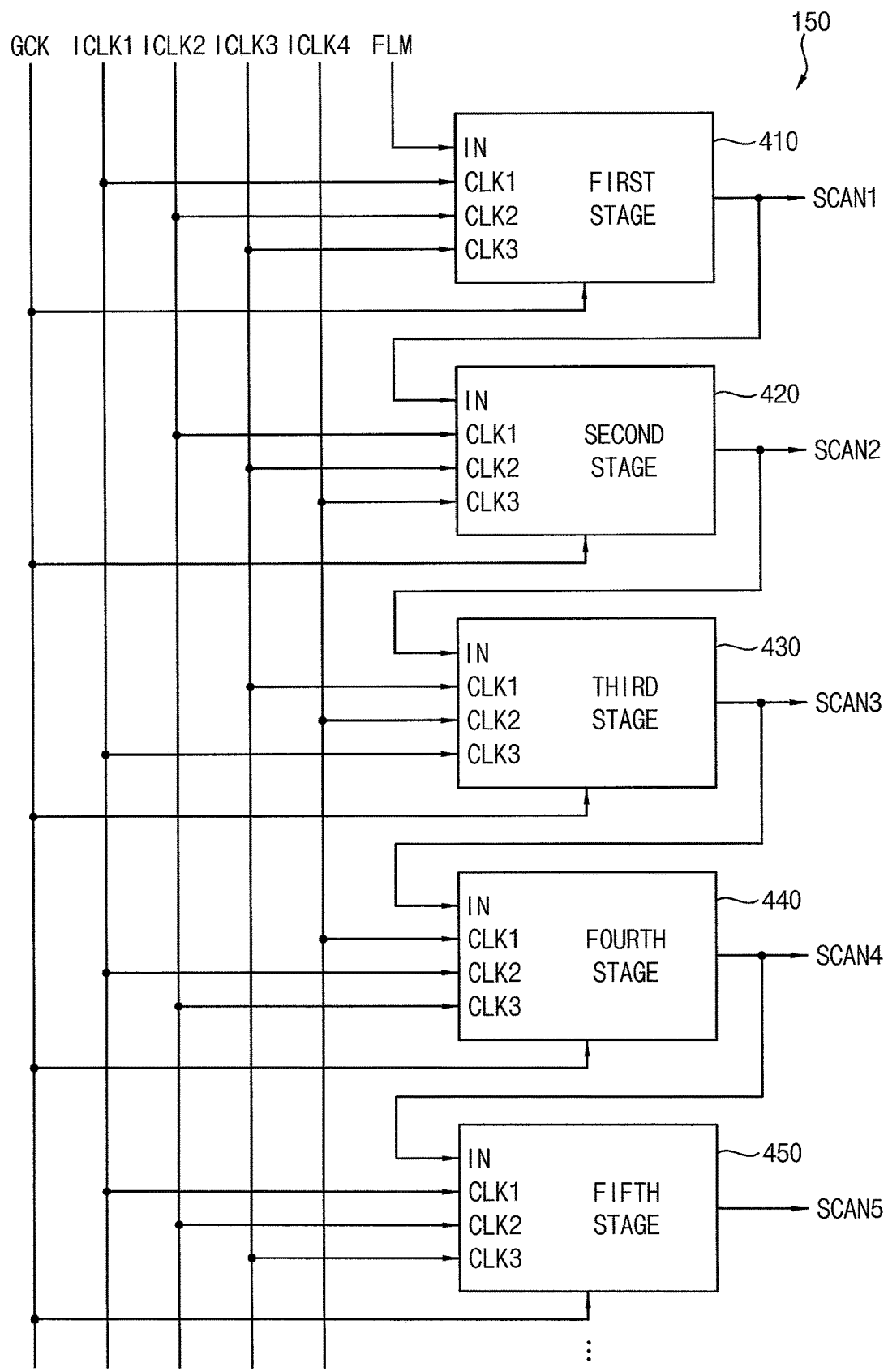
FIG. 4 is a block diagram illustrating an example of a scan driver included in the display device in FIG. 1.

FIG. 4 is a block diagram illustrating an example of the scan driver 150 included in the display device 100 in FIG. 1.

Referring to FIG. 4, the scan driver 150 may receive the start signal FLM, first through fourth input clock signals ICLK1, ICLK2, ICLK3, and ICLK4, and the concurrent driving signal GCK, and may include a plurality of stages 410, 420, 430, 440, and 450 respectively outputting a plurality of scan signals SCAN1, SCAN2, SCAN3, SCAN4, and SCAN5 to the scan lines SL1, . . . , SLn, . . . , SLN.

Each stage 410, 420, 430, 440, and 450 may receive, as an input signal IN, the start signal FLM or a previous scan signal. For example, a first stage 410 may receive the start signal FLM as the input signal IN, and other stages 420, 430, 440, and 450 may respectively receive, as the input signal IN, the scan signals SCAN1, SCAN2, SCAN3, and SCAN4 of their respective previous stages 420, 430, 440, and 450.

Further, four adjacent stages (e.g., 410, 420, 430, and 440) may receive, as first through third clock signals CLK1, CLK2, and CLK3, different sets of three signals among the first through fourth input clock signals ICLK1, ICLK2, ICLK3, and ICLK4 that are sequentially activated. For example, the first stage 410 may receive the first through third input clock signals ICLK1, ICLK2, and ICLK3 as the first through third clock signals CLK1, CLK2, and CLK3, respectively, a second stage 420 may receive the second through fourth input clock signals ICLK2, ICLK3, and ICLK4 as the first through third clock signals CLK1, CLK2, and CLK3, respectively, a third stage 430 may receive the third, fourth, and first input clock signals ICLK3, ICLK4, and ICLK1 as the first through third clock signals CLK1, CLK2, and CLK3, respectively, and a fourth stage 440 may receive the fourth, first, and second input clock signals ICLK4, ICLK1, and ICLK2 as the first through third clock signals CLK1, CLK2, and CLK3, respectively. Similarly to the first stage 410, a fifth stage 450 may receive the first through third input clock signals ICLK1, ICLK2, and ICLK3 as the first through third clock signals CLK1, CLK2, and CLK3, respectively.

In an embodiment, in the data programming period, each stage 410, 420, 430, 440, and 450 may receive the input signal IN in response to a pulse of the second clock signal CLK2, and may output a following pulse of the third clock signal CLK3 as the scan signal SCAN1, SCAN2, SCAN3, SCAN4, and SCAN5.

For example, the first stage 410 may output a next pulse of the third input clock signal ICLK3 as a first scan signal SCAN1, then the second stage 420 may output a next pulse of the fourth input clock signal ICLK4 as a second scan signal SCAN2, then the third stage 430 may output a next pulse of the first input clock signal ICLK1 as a third scan signal SCAN3, then the fourth stage 440 may output a next pulse of the second input clock signal ICLK2 as a fourth scan signal SCAN4, and then the fifth stage 450 may output a next pulse of the third input clock signal ICLK3 as a fifth scan signal SCAN5. In this manner, the plurality of stages 410, 420, 430, 440, and 450 may sequentially output the plurality of scan signals SCAN1, SCAN2, SCAN3, SCAN4, and SCAN5 in response to the input clock signals ICLK1, ICLK2, ICLK3, and ICLK4 that are sequentially activated.

In an embodiment, in the concurrent compensation period, the plurality of stages 410, 420, 430, 440, and 450 may concurrently receive the concurrent driving signal GCK, and may concurrently output the plurality of scan signals SCAN1, SCAN2, SCAN3, SCAN4, and SCAN5 in response to the concurrent driving signal GCK.

Figure 5:
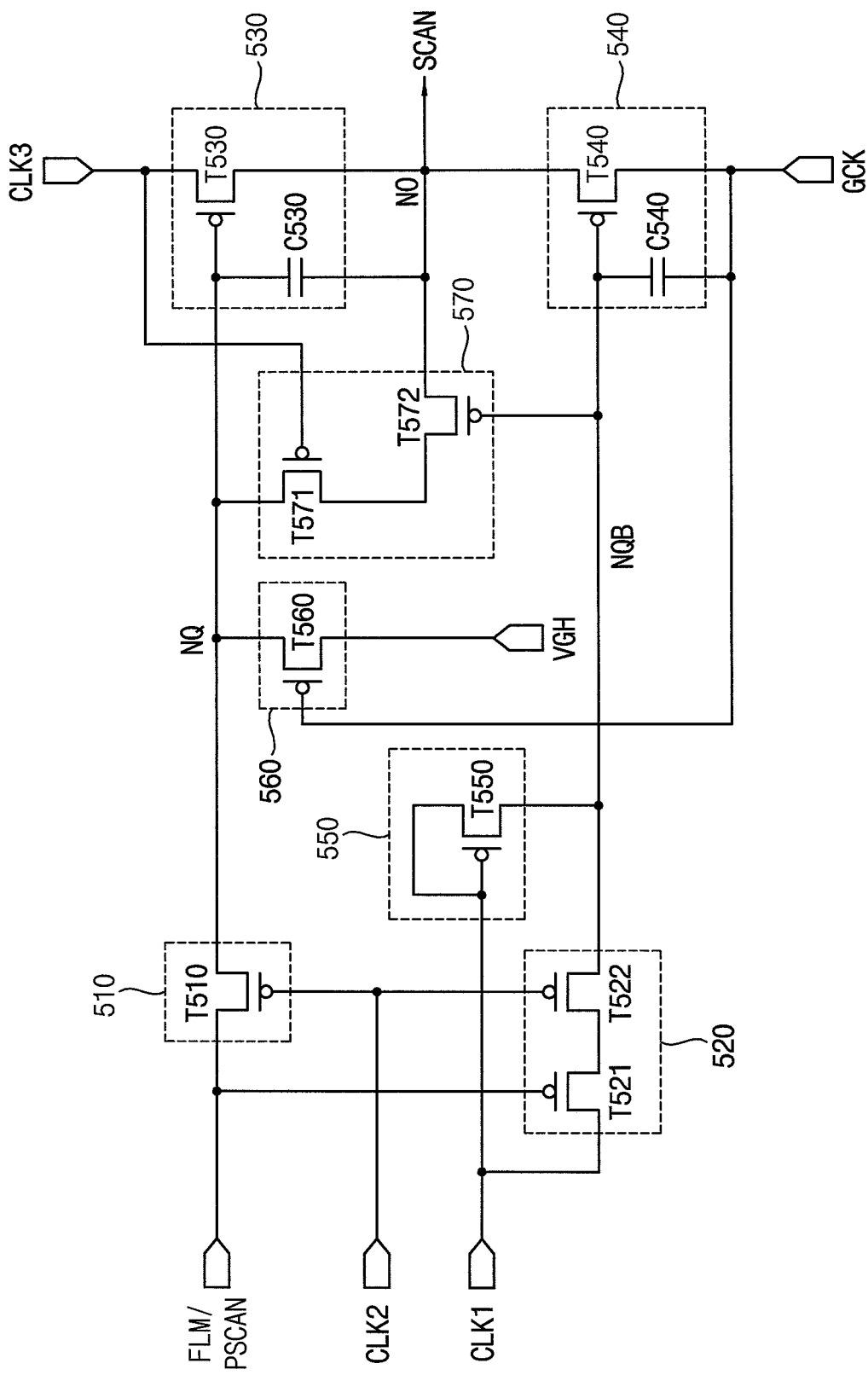
FIG. 5 is a circuit diagram illustrating an example of a stage included in the scan driver in FIG. 4.

FIG. 5 is a circuit diagram illustrating an example of a stage included in the scan driver 150 in FIG. 4.

Referring to FIG. 5, each stage included in the scan driver 150 may include a first input part 510, a second input part 520, a first output part 530, and a second output part 540. In an embodiment, each stage may further include a holding part 550, a concurrent driving controlling part 560, and a stabilizing part 570.

The first input part 510 may transfer the input signal IN to a set node NQ in response to the second clock signal CLK2. For example, the first input part 510 of a first stage may receive the start signal FLM as the input signal IN, and the first input part 510 of each of remaining stages may receive a previous scan signal PSCAN as the input signal IN. In an embodiment, the first input part 510 may include a first input transistor T510 including a gate receiving the second clock signal CLK2, a first terminal receiving the input signal IN, and a second terminal connected to the set node NQ.

The second input part 520 may transfer the first clock signal CLK1 to a reset node NQB in response to the input signal IN and the second clock signal CLK2. For example, when the input signal IN and the second clock signal CLK2 have active levels (or low levels in an example of FIG. 5), the second input part 520 may transfer the first clock signal CLK1 having an inactive level (or a high level in the example of FIG. 5) to the reset node NQB. In an embodiment, the second input part 520 may include a second input transistor T521 including a gate receiving the input signal IN, a first terminal receiving the first clock signal CLK1, and a second terminal, and may also include a third input transistor T522 including a gate receiving the second clock signal CLK2, a first terminal connected to the second terminal of the second input transistor T521, and a second terminal connected to the reset node NQB.

The holding part 550 may hold a voltage of the reset node NQB in response to the first clock signal CLK1. For example, the holding part 550 may hold the voltage of the reset node NQB as the low level when the first clock signal CLK1 has a low level. In an embodiment, the holding part 550 may include a holding transistor T550 including a gate receiving the first clock signal CLK1, a first terminal receiving the first clock signal CLK1, and a second terminal connected to the reset node NQB.

The concurrent driving controlling part 560 may deactivate the first output part 530 in response to the concurrent driving signal GCK. In an embodiment, the concurrent driving signal GCK may have the low level in the concurrent compensation period, and may have the high level in remaining periods (e.g., the data programming period and the concurrent emission period). In the concurrent compensation period, the concurrent driving controlling part 560 may transfer a gate off voltage VGH (or a high gate voltage VGH) having the high level to the set node NQ in response to the concurrent driving signal GCK. The first output part 530 may be deactivated by the gate off voltage VGH of the set node NQ. In an embodiment, the concurrent driving controlling part 560 may include a concurrent driving controlling transistor T560 including a gate receiving the concurrent driving signal GCK, a first terminal receiving the gate off voltage VGH, and a second terminal connected to the set node NQ.

The stabilizing part 570 may stabilize the scan signal SCAN in response to a voltage of a reset node NQB and the third clock signal CLK3. For example, when the voltage of the reset node NQB and the third clock signal CLK3 have the low levels, the stabilizing part 570 may stabilize the scan signal SCAN to the high level. In an embodiment, the stabilizing part 570 may include a first stabilizing transistor T571 including a gate receiving the third clock signal CLK3, a first terminal connected to the set node NQ, and a second terminal, and may also include a second stabilizing transistor T572 including a gate connected to the reset node NQB, a first terminal connected to the second terminal of the first stabilizing transistor T571, and a second terminal connected to an output node NO.

The first output part 530 may output the third clock signal CLK3 as the scan signal SCAN in response to a voltage of the set node NQ. For example, in the data programming period, the input signal IN having the low level may be transferred to the set node NQ in response to a pulse of the second clock signal CLK2, then the voltage of the set node NQ may be boosted by a first output capacitor C530 of the first output part 530 to a level that is lower than the low level at a next pulse of the third clock signal CLK3. In an embodiment, the first output part 530 may include the first output transistor T530 including a gate connected to the set node NQ, a first terminal receiving the third clock signal CLK3, and a second terminal connected to the output node NO, and also may include the first capacitor C530 including a first electrode connected to the set node NQ and a second electrode connected to the output node NO.

The second output part 540 may output the concurrent driving signal GCK as the scan signal SCAN in response to the voltage of the reset node NQB. For example, in the concurrent compensation period, when the concurrent driving signal GCK transitions from the high level to the low level, the voltage of the reset node NQB may be boosted by a second output capacitor C540 of the second output part 540 to a level that is lower than the low level. A second output transistor T540 of the second output part 540 may output the concurrent driving signal GCK having the low level as the scan signal SCAN in response to the boosted voltage of the reset node NQB. In an embodiment, the second output part 540 may include the second output transistor T540 including a gate connected to the reset node NQB, a first terminal receiving the concurrent driving signal GCK, and a second terminal connected to the output node NO, and may also include the second output capacitor C540 including a first electrode connected to the reset node NQB and a second electrode receiving the concurrent driving signal GCK.

Figure 6:
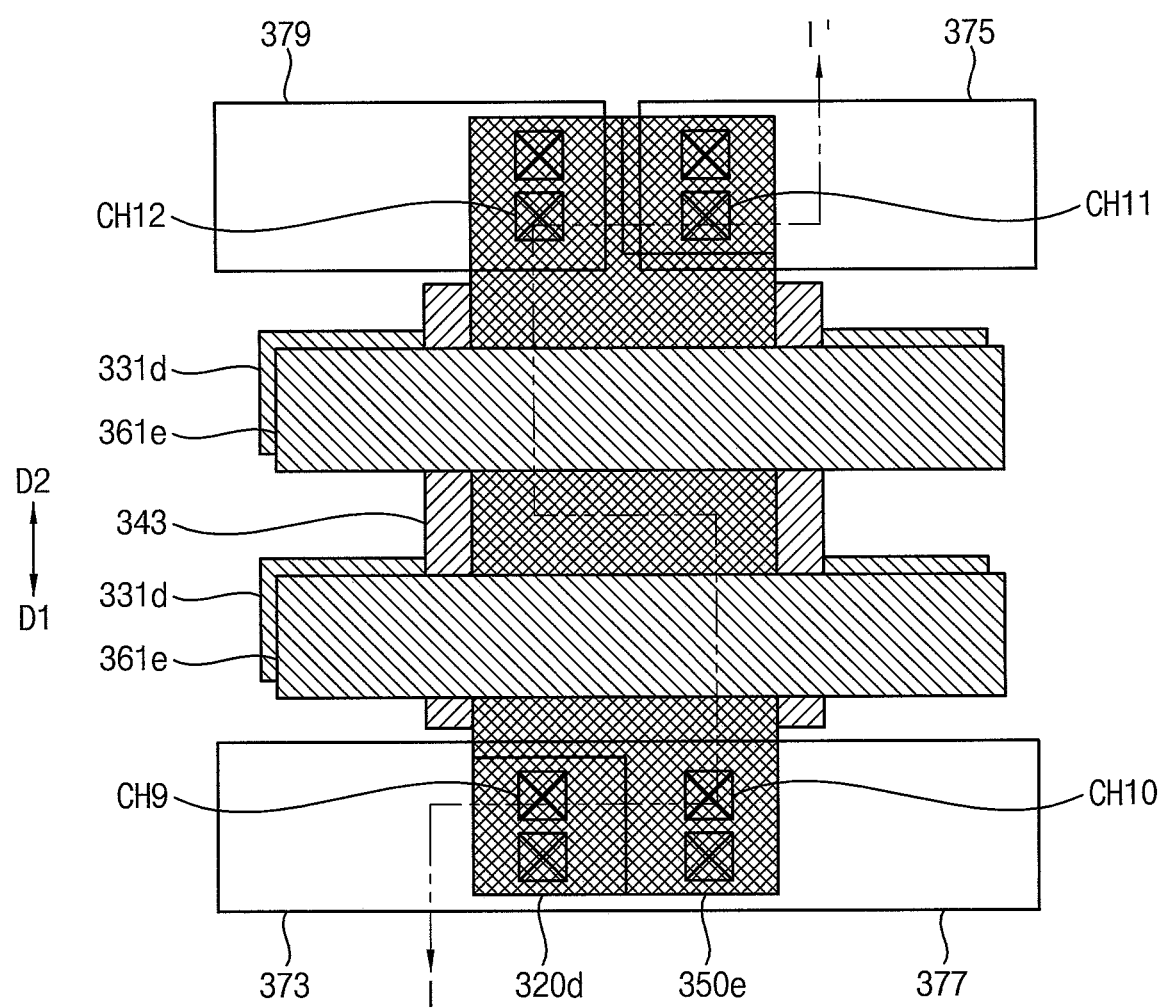
FIG. 6 is a plan view illustrating a scan driver according to an embodiment.
Figure 7:
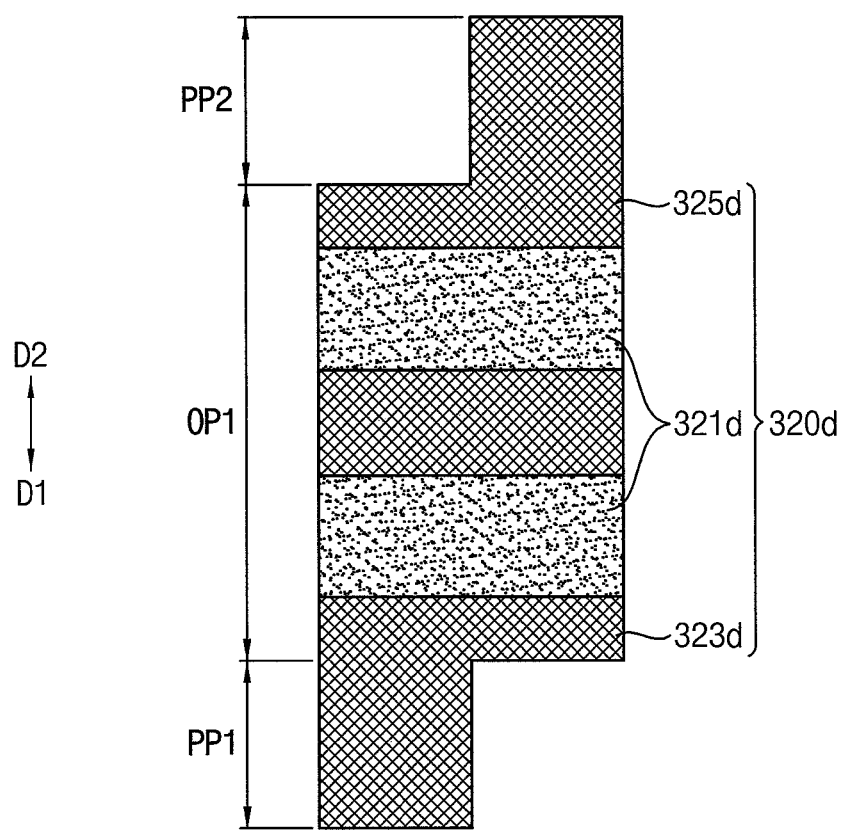
FIG. 7 is a plan view illustrating a first active pattern included in the scan driver in FIG. 6.
Figure 8:
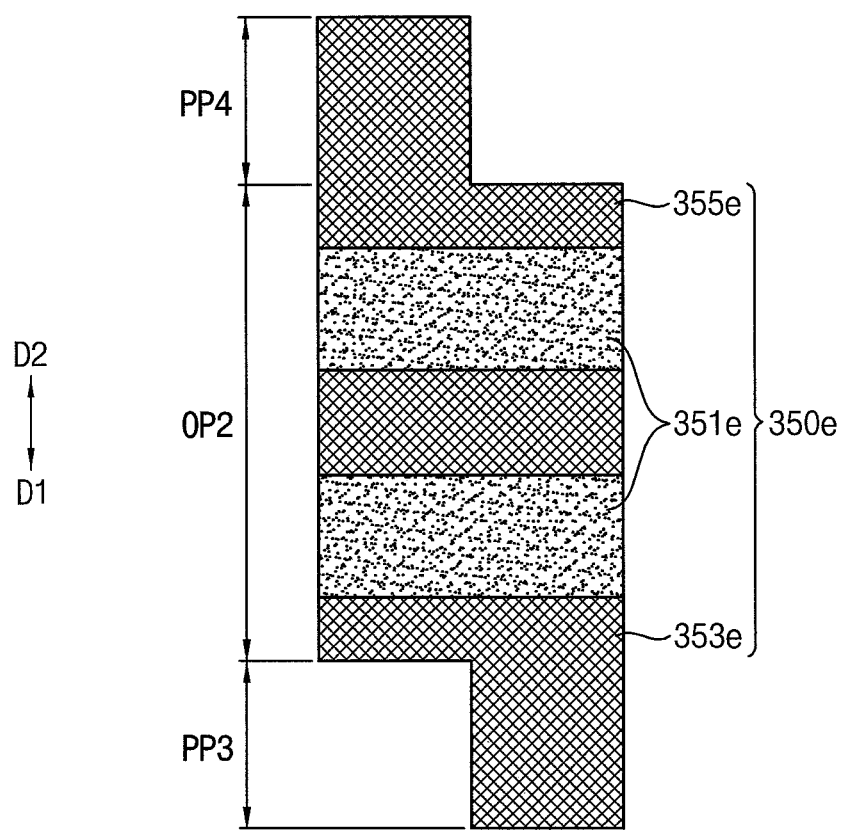
FIG. 8 is a plan view illustrating a second active pattern included in the scan driver in FIG. 6.
Figure 9:
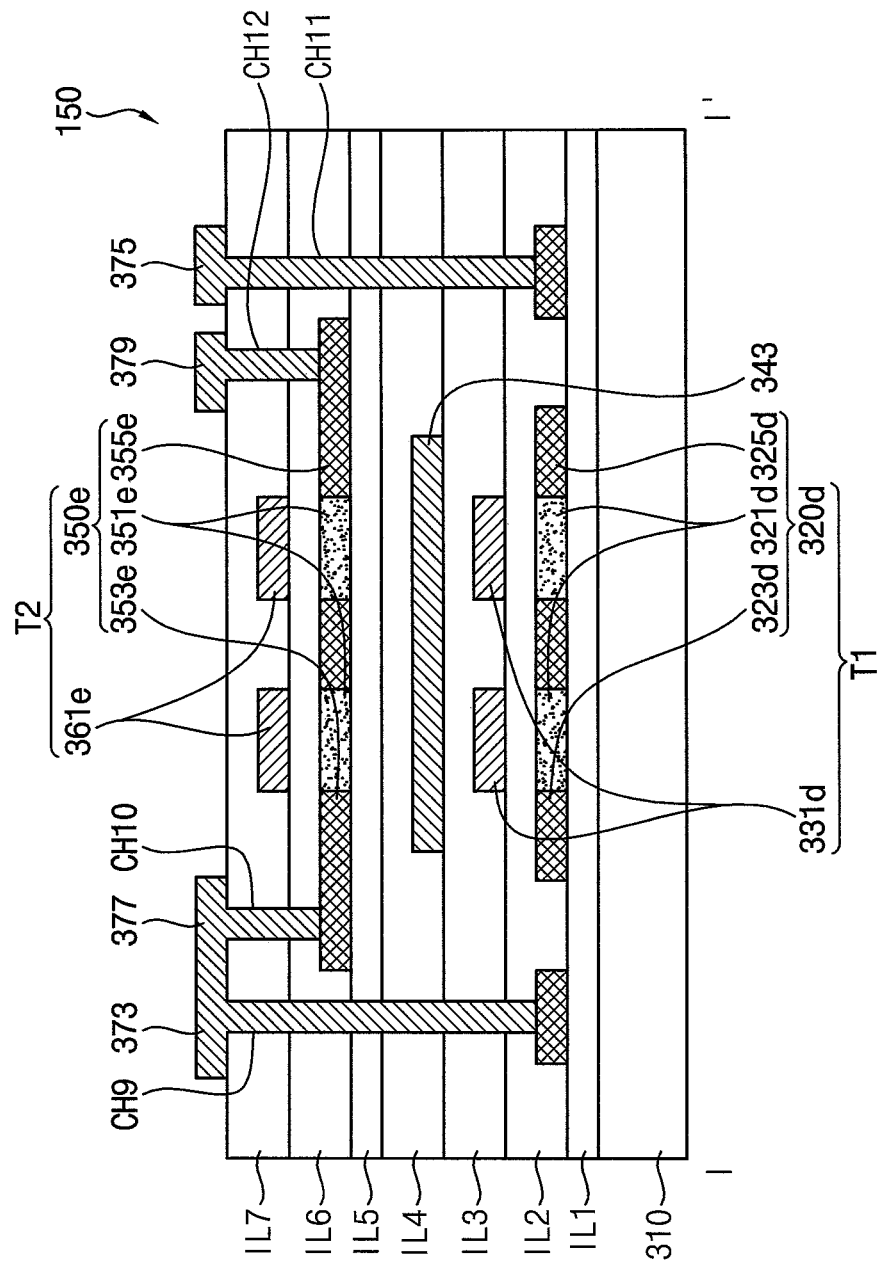
FIG. 9 is a cross-sectional view taken along the line I-I' in FIG. 6.

FIG. 6 is a plan view illustrating the scan driver 150 according to an embodiment. FIG. 7 is a plan view illustrating a first active pattern included in the scan driver 150 in FIG. 6. FIG. 8 is a plan view illustrating a second active pattern included in the scan driver 150 in FIG. 6. FIG. 9 is a cross-sectional view taken along the line I-I' in FIG. 6.

Referring to FIGS. 6, 7, 8, and 9, the scan driver 150 may include a first transistor T1 located on the substrate 310, and a second transistor T2 located on the first transistor T1 and overlapping the first transistor T1. In an embodiment, the scan driver 150 may further include a shielding electrode 343 located between the first transistor T1 and the second transistor T2.

As shown in FIG. 9, a first active pattern 320d including a first channel region 321d, and a first region 323d and a second region 325d formed with the first channel region 321d in between, may be formed on the first insulation layer IL1. A first active layer 320a and 320d may include the first active pattern 320d together with the driving active pattern 320a formed in the display unit 110. For example, the first region 323d and the second region 325d may be a source region and a drain region of the first active pattern 320d, respectively.

As shown in FIG. 7, the first active pattern 320d may include a first overlapping portion OP1, a first protruding portion PP1, and a second protruding portion PP2. The first protruding portion PP1 and the second protruding portion PP2 may protrude from the first overlapping portion OP1. For example, the first protruding portion PP1 may protrude from the first overlapping portion OP1 in a first direction D1, and the second protruding portion PP2 may protrude from the first overlapping portion OP1 in a second direction D2 that is opposite to the first direction D1. The first protruding portion PP1 may be formed in the first region 323d, and the second protruding portion PP2 may be formed in the second region 325d.

As shown in FIG. 9, a first gate electrode 331d overlapping the first channel region 321d may be formed on the second insulation layer IL2. The first conductive layer 331a and 331d may include the first gate electrode 331d together with the driving gate electrode 331a formed in the display unit 110. The first gate electrode 331d may form the first transistor T1 together with the first active pattern 320d. The first transistor T1 may have a dual gate structure as shown in FIGS. 6 and 9. However, the present embodiment is not limited thereto, and the first transistor T1 may have a single gate structure.

The shielding electrode 343 overlapping the first gate electrode 331d may be formed on the third insulation layer IL3. The second conductive layer 341 and 343 may further include the shielding electrode 343 together with the second storage electrode 341 formed in the display unit 110. The shielding electrode 343 may be located between the first transistor T1 and the second transistor T2, which are stacked. Thus, the shielding electrode 343 may minimize or reduce effects such as parasitic capacitance, kick back, etc. between the first transistor T1 and the second transistor T2.

In an embodiment, a width of the shielding electrode 343 may be greater than a width of the first gate electrode 331d. For example, the width of the shielding electrode 343 may be greater than an addition of widths of two areas of the first gate electrode 331d having the dual gate structure. Accordingly, the shielding electrode 343 may entirely cover the first gate electrode 331d. The width of the shielding electrode 343 may be greater than the width of the first gate electrode 331d, therefore, impact between the first transistor T1 and the second transistor T2 may be further reduced.

In an embodiment, a voltage for controlling characteristics of the second transistor T2 may be applied to the shielding electrode 343. For example, a driving range, s-factor, etc. of the second transistor T2 may be controlled by the voltage applied to the shielding electrode 343. Impact between the first transistor T1 and the second transistor T2 may be reduced or minimized when a characteristic of the first transistor T1 and a characteristic of the second transistor T2 are substantially the same or similar. Accordingly, a characteristic of the second transistor T2 may be controlled by applying the voltage to the shielding electrode 343, thus, impact between the first transistor T1 and the second transistor T2 may be controlled.

In an embodiment, the driving range of the second transistor T2 may become wide when a negative voltage is applied to the shielding electrode 343, and the driving range of the second transistor T2 may become narrow when a positive voltage is applied to the shielding electrode 343. Accordingly, the negative voltage may be applied to the shielding electrode 343 when the driving range of the second transistor T2 is narrower than a driving range of the first transistor T1, and the positive voltage may be applied to the shielding electrode 343 when the driving range of the second transistor T2 is wider than the driving range of the first transistor T1, to thereby reduce impact between the first transistor T1 and the second transistor T2.

A second active pattern 350e including a second channel region 351e, and a third region 353e and a fourth region 355e formed with the second channel region 351e in between, may be formed on the fifth insulation layer IL5. The second active layer 350b, 350c, and 350e may further include the second active pattern 350e together with the first switching active pattern 350b and the second switching active pattern 350c formed in the display unit 110. For example, the third region 353e and the fourth region 355e may respectively be a source region and a drain region of the second active pattern 350e.

As shown in FIG. 8, the second active pattern 350e may overlap the first active pattern 320d. The second active pattern 350e may include a second overlapping portion OP2, a third protruding portion PP3, and a fourth protruding portion PP4. The second overlapping portion OP2 of the second active pattern 350e may overlap the first overlapping portion OP1 of the first active pattern 320d. The third protruding portion PP3 and the fourth protruding portion PP4 may protrude from the second overlapping portion OP2. For example, the third protruding portion PP3 may protrude from the second overlapping portion OP2 in the first direction D1, and the fourth protruding portion PP4 may protrude from the second overlapping portion OP2 in the second direction D2. The third protruding portion PP3 may be formed in the third region 353e, and the fourth protruding portion PP4 may be formed in the fourth region 355e. The third protruding portion PP3 might not overlap the first protruding portion PP1, and the fourth protruding portion PP4 might not overlap the second protruding portion PP2.

As shown in FIG. 9, a second gate electrode 361e overlapping the second channel region 351e may be formed on the sixth insulation layer IL6. The third conductive layer 361b, 361c, 361e, 363, and 365 may further include the second gate electrode 361e together with the first switching gate electrode 361b, the second switching gate electrode 361c, the first connecting pattern 363, and the second connecting pattern 365 formed in the display unit 110. The second gate electrode 361e may form the second transistor T2 together with the second active pattern 350e. The second transistor T2 may have a dual gate structure as shown in FIGS. 6 and 9. However, the present embodiment is not limited thereto, and the second transistor T2 may have a single gate structure.

Contact holes CH9, CH10, CH11, and CH12 may be formed in the seventh insulation layer IL7. A first electrode 373, a second electrode 375, a third electrode 377, and a fourth electrode 379 may be formed on the seventh insulation layer IL7. The fourth conductive layer 371, 373, 375, 377, and 379 may further include the first electrode 373, the second electrode 375, the third electrode 377, and the fourth electrode 379 together with the first program electrode 371 formed in the display unit 110. However, the present embodiment is not limited thereto, and the first electrode, the second electrode, the third electrode, and the fourth electrode may be formed on the eighth insulation layer IL8. For example, the fifth conductive layer 381 and 383 may include the first electrode, the second electrode, the third electrode, and the fourth electrode together with the first power supply signal line 381 and the second program electrode 383 formed in the display unit 110.

The first electrode 373 may be connected to the first region 323d through a ninth contact hole CH9 formed in the second, third, fourth, fifth, sixth, and seventh insulation layers IL2, IL3, IL4, IL5, IL6, and IL7. The ninth contact hole CH9 may expose the first protruding portion PP1 of the first active pattern 320d, and the first electrode 373 may be in contact with the first protruding portion PP1 through the ninth contact hole CH9.

The second electrode 375 may be connected to the second region 325d through an eleventh contact hole CH11 formed in the second, third, fourth, fifth, sixth, and seventh insulation layers IL2, IL3, IL4, IL5, IL6, and IL7. The eleventh contact hole CH11 may expose the second protruding portion PP2 of the first active pattern 320d, and the second electrode 375 may be in contact with the second protruding portion PP2 through the eleventh contact hole CH11.

The third electrode 377 may be connected to the third region 353e through a tenth contact hole CH10 formed in the sixth and seventh insulation layers IL6 and IL7. The tenth contact hole CH10 may expose the third protruding portion PP3 of the second active pattern 350e, and the third electrode 377 may be in contact with the third protruding portion PP3 through the tenth contact hole CH10.

The fourth electrode 379 may be connected to the fourth region 355e through a twelfth contact hole CH12 formed in the sixth and seventh insulation layers IL6 and IL7. The twelfth contact hole CH12 may expose the fourth protruding portion PP4 of the second active pattern 350e, and the fourth electrode 379 may be in contact with the fourth protruding portion PP4 through the twelfth contact hole CH12.

The second transistor T2 overlapping the first transistor T1 may be located thereon. The first electrode 373 and the second electrode 375 connected to the first transistor T1 and the third electrode 377 and the fourth electrode 379 connected to the second transistor T2 may be located on the second transistor T2. The first active pattern 320d may include the protruding portions PP1 and PP2 that do not overlap the protruding portions PP3 and PP4 of the second active pattern 350e, and thus may be connected to the first electrode 373 and the second electrode 375 located above the second active pattern 350e even though the first active pattern 320d overlaps the second active pattern 350e.

In an embodiment, the first electrode 373 may be integrally formed with the third electrode 377. In this case, the first region 323d may be electrically connected to the third region 353e, and a terminal of the first transistor T1 may be electrically connected to a terminal of the second transistor T2.

In embodiments, the first transistor T1 and the second transistor T2 may be included in different stages. For example, the first transistor T1 may be a transistor included in a first stage, and the second transistor T2 may be a transistor included in a second stage. In an embodiment, the first transistor T1 may be the first output transistor T530 of the first stage, and the second transistor T2 may be the first output transistor T530 of the second stage. In an embodiment, the first transistor T1 may be the second output transistor T540 of the first stage, and the second transistor T2 may be the second output transistor T540 of the second stage. However, the present embodiments are not limited thereto, and the first transistor T1 may be any transistor outside the first and second output transistors T530 and T540 of the first stage, and the second transistor T2 may be any transistor outside the first and second output transistors T530 and T540 of the second stage.

In embodiments, the first transistor T1 and the second transistor T2 may be included in the same stage. For example, the first transistor T1 and the second transistor T2 may be transistors included in a first stage. In an embodiment, the first transistor T1 may be the first output transistor T530 of the first stage, and the second transistor T2 may be the second output transistor T540 of the first stage. However, the present embodiments are not limited thereto, and the first transistor T1 may be any transistor outside the first and second output transistors T530 and T540 of the first stage, and the second transistor T2 may be any transistor outside the first and second output transistors T530 and T540 of the first stage.

As illustrated in FIGS. 6 and 9, the first active pattern 320d and the second active pattern 350e located at different layers may be formed in the scan driver 150. Therefore, the transistors T1 and T2 included in the scan driver 150 may overlap each other. Accordingly, an area occupied by the transistors T1 and T2 may decrease, an area of the scan driver 150 may decrease, and the display device 100 having a more narrow dead space may be formed.

Figure 10:
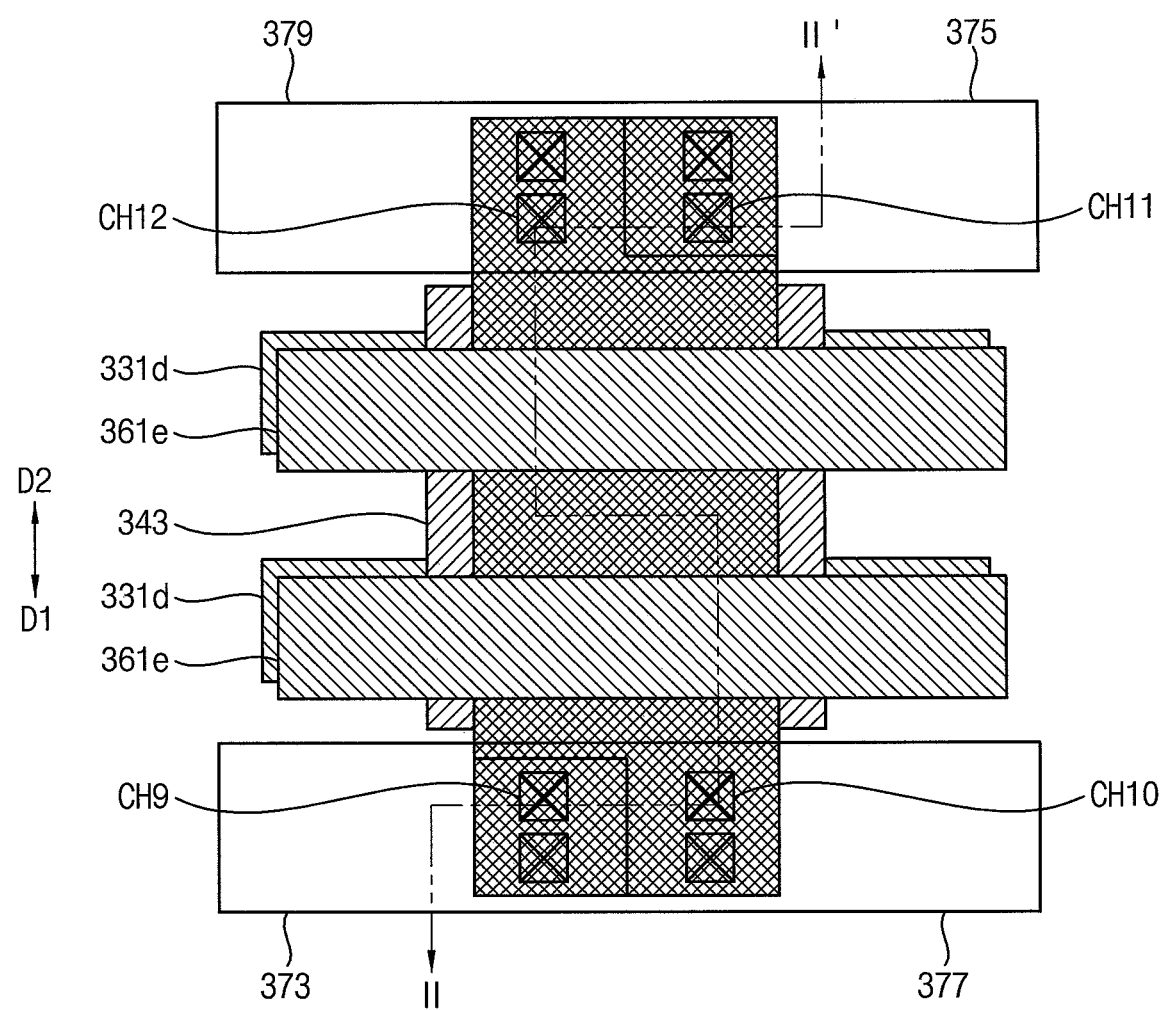
FIG. 10 is a plan view illustrating a scan driver according to an embodiment.
Figure 11:
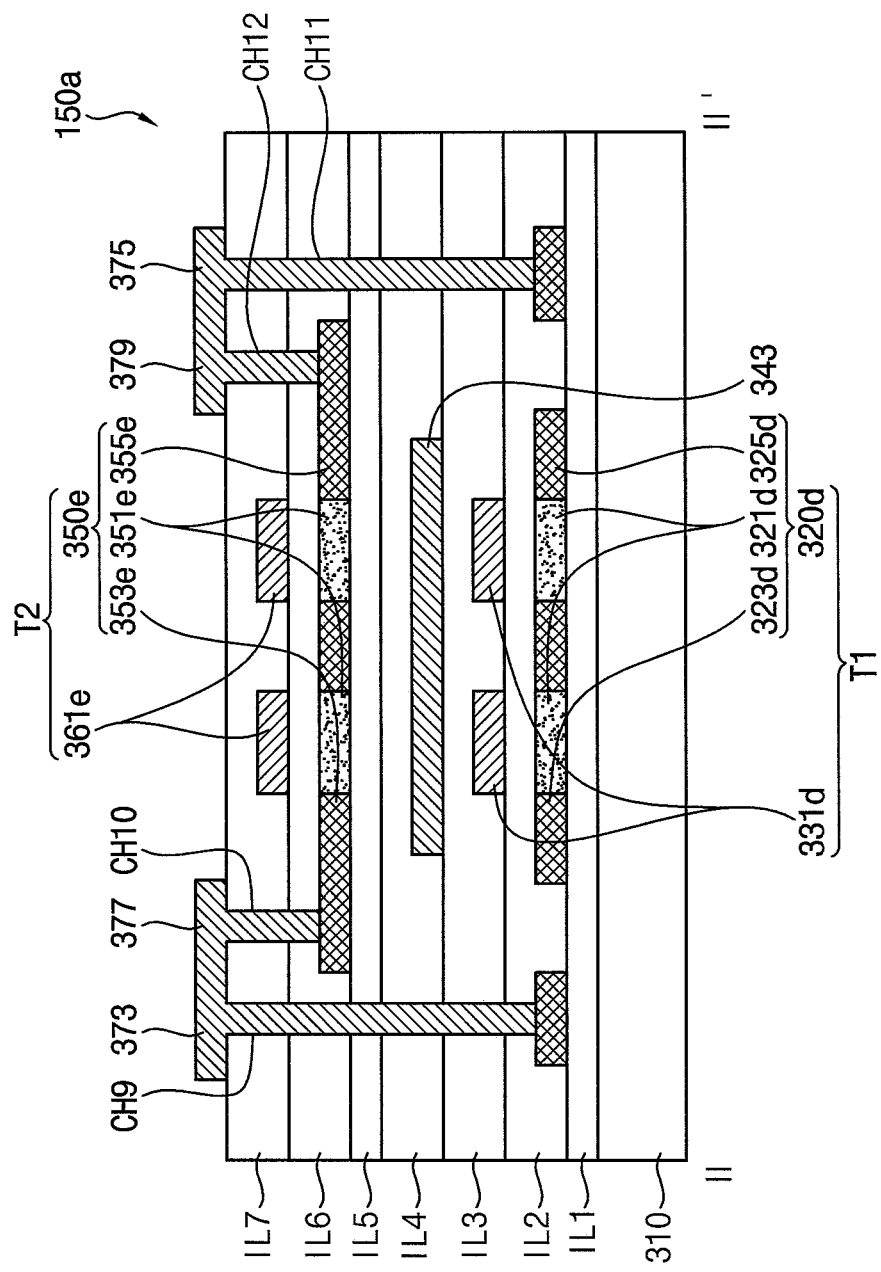
FIG. 11 is a cross-sectional view taken along the line II-II' in FIG. 10.

FIG. 10 is a plan view illustrating a scan driver 150a according to an embodiment. FIG. 11 is a cross-sectional view taken along the line II-II' in FIG. 10.

Detailed descriptions on elements of the scan driver 150a described with reference to FIGS. 10 and 11, which are substantially the same as or similar to those of the scan driver 150 described with reference to FIGS. 6 to 9, may not be repeated.

Referring to FIGS. 10 and 11, in an embodiment, the first electrode 373 may be integrally formed with the third electrode 377, and the second electrode 375 may be integrally formed with the fourth electrode 379. In this case, the first region 323d may be electrically connected to the third region 353e, and the second region 325d may be electrically connected to the fourth region 355e. Accordingly, one terminal of the first transistor T1 may be electrically connected to one terminal of the second transistor T2, and another terminal of the first transistor T1 may be electrically connected to another terminal of the second transistor T2.

Figure 12:
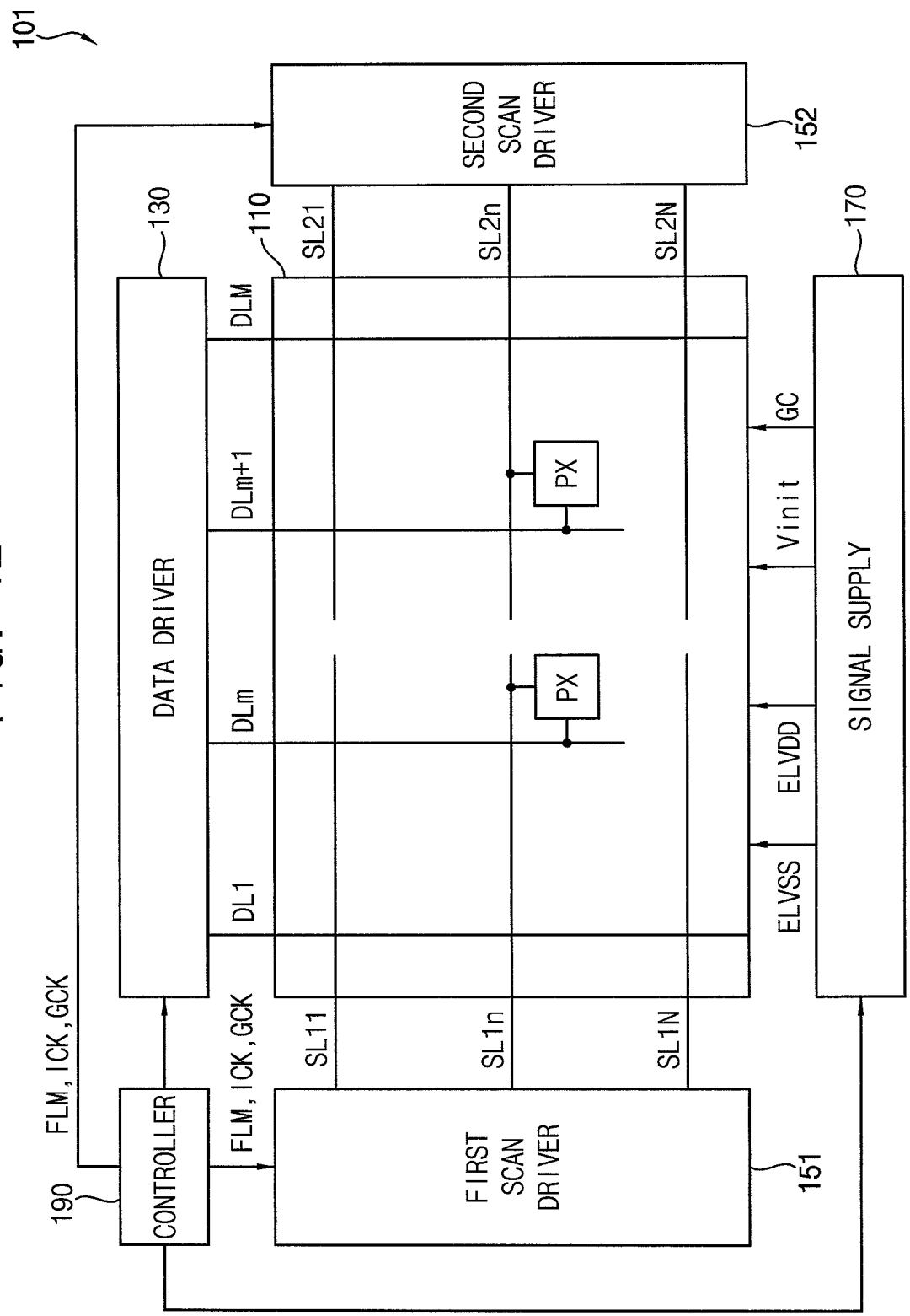
FIG. 12 is a block diagram illustrating a display device according to an embodiment.

FIG. 12 is a block diagram illustrating a display device according to an embodiment.

Referring to FIG. 12, a display device 101 may include a display unit 110, a data driver 130 providing data signals to the display unit 110, a first scan driver 151 and a second scan driver 152 providing scan signals to the display unit 110, and a signal supply 170 providing signals to the display unit 110. In an embodiment, the display device 101 may further include a controller (e.g., a timing controller) 190 controlling the data driver 130, the first scan driver 151, the second scan driver 152, and the signal supply 170. Detailed descriptions on elements of the display device 101 described with reference to FIG. 12, which are substantially the same as or similar to those of the display device 100 described with reference to FIG. 1, may not be repeated.

The display unit 110 may include a plurality of data lines DL1, ..., DLm, DLm+1, ..., DLM, a plurality of first scan lines SL11, ..., SL1n, ..., SL1N, a plurality of second scan lines SL21, ..., SL2n, ..., SL2N, and a plurality of pixels PX connected to the data lines DL1, ..., DLm, ..., DLM and the first scan lines SL11, ..., SL1n, ..., SL1N, or the data lines DL1, ..., DLm, ..., DLM and the second scan lines SL21, ..., SL2n, ..., SL2N.

The first scan driver 151 may output the scan signals SCAN to the first scan lines SL11, ..., SL1n, ..., SL1N based on a gate control signal from the controller 190. Pixels PX receiving the scan signals SCAN from the first scan lines SL11, ..., SL1n, ..., SL1N may receive the data signals DATA from some data lines DL1, ..., DLm among the data lines DL1, ..., DLm, DLm+1, ..., DLM.

The second scan driver 152 may output the scan signals SCAN to the second scan lines SL21, ..., SL2n, ..., SL2N based on a gate control signal from the controller 190. Pixels PX receiving the scan signals SCAN from the second scan lines SL21, ..., SL2n, ..., SL2N may receive the data signals DATA from some data lines DLm+1, ..., DLM among the data lines DL1, ..., DLm, DLm+1, ..., DLM.

The first scan driver 151 and the second scan driver 152 may be located to be opposite to each other with the display unit 110 in between. For example, the first scan driver 151 may be located at a first side (e.g., a left side) of the display unit 110, and the second scan driver 152 may be located at a second side (e.g., a right side) opposite to the first side of the display unit 110. For example, the first scan driver 151 may be connected to the pixels PX located on one side of a center of the display unit 110 among the pixels PX of the display unit 110, and the second scan driver 152 may be connected to the pixels PX located on the other side of the center of the display unit 110 among the pixels PX of the display unit 110.

When the display device 101 is a high resolution display device including relatively large number of pixels PX, relatively large number of pixels may be connected to each scan line. In this case, a resistance of the scan line may increase, a transmission of scan signals SCAN through the scan line may be delayed. However, the display device 101 according to the present embodiment may include the first scan driver 151 and the second scan driver 152, ones of the pixels PX may be connected to the first scan driver 151, and other ones of the pixels PX may be connected to the second scan driver 152. Therefore, transmission delay of the scan signals SCAN through the scan lines SL11, ..., SL1n, ..., SL1N, SL21, ..., SL2n, ..., SL2N may be decreased or substantially prevented.

Figure 13:
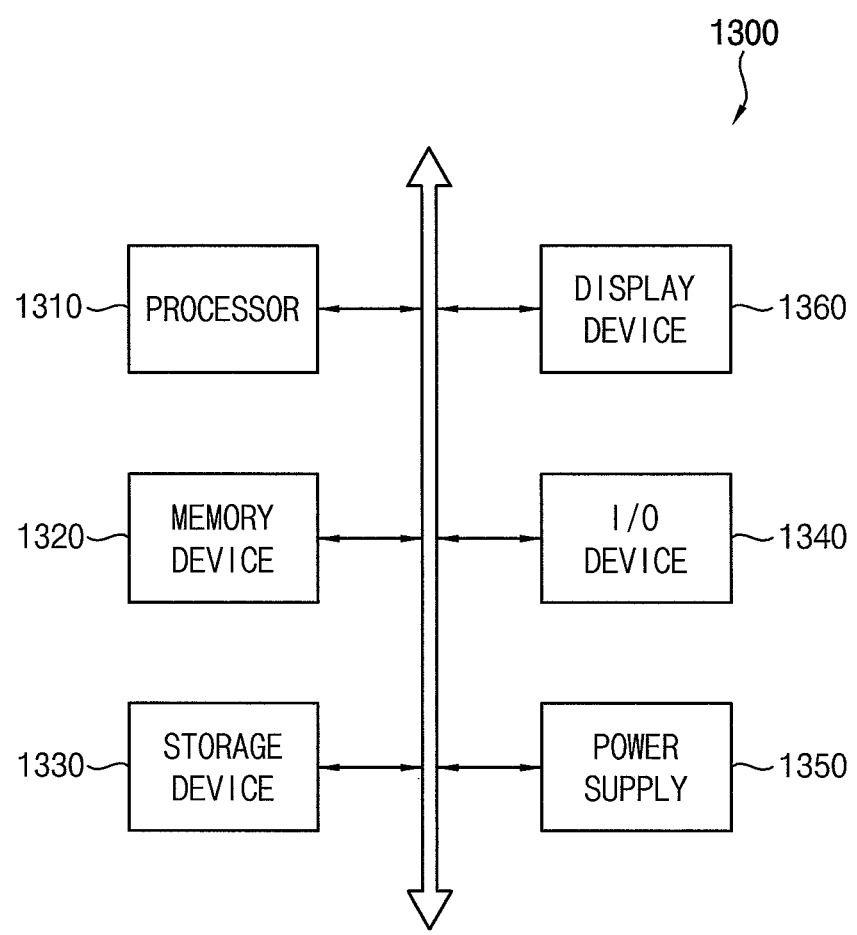
FIG. 13 is a block diagram illustrating an electronic device including a display device according to an embodiment.
Figure 14:
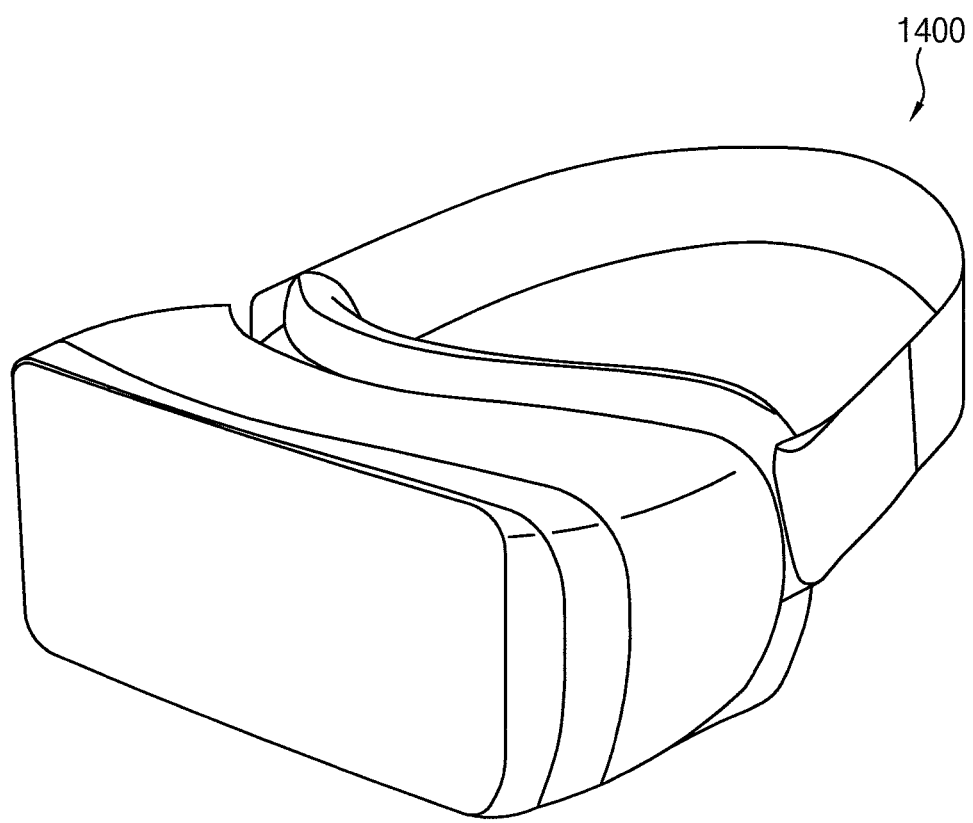
FIG. 14 is a diagram illustrating an example in which the electronic device of FIG. 13 is implemented as a head-mounted display (HMD).

FIG. 13 is a block diagram illustrating an electronic device including a display device according to an embodiment. FIG. 14 is a diagram illustrating an example in which the electronic device of FIG. 13 is implemented as a head-mounted display (HMD).

Referring to FIG. 13, an electronic device 1300 may include a processor 1310, a memory device 1320, a storage device 1330, an input/output (I/O) device 1340, a power supply 1350, and a display device 1360. The electronic device 1300 may further include a plurality of ports for communicating with a video card, a sound card, a memory card, a universal serial bus (USB) device, other electric devices, etc.

The processor 1310 may perform various computing functions or tasks. The processor 1310 may be an application processor (AP), a microprocessor, a central processing unit (CPU), etc. The processor 1310 may be coupled to other components via an address bus, a control bus, a data bus, etc. Further, in an embodiment, the processor 1310 may be further coupled to an extended bus such as a peripheral component interconnect (PCI) bus.

The memory device 1320 may store data for operations of the electronic device 1300. For example, the memory device 1320 may include at least one non-volatile memory device such as an erasable programmable read-only memory (EPROM) device, an electrically erasable programmable read-only memory (EEPROM) device, a flash memory device, a phase change random access memory (PRAM) device, a resistance random access memory (RRAM) device, a nano floating gate memory (NFGM) device, a polymer random access memory (PoRAM) device, a magnetic random access memory (MRAM) device, a ferroelectric random access memory (FRAM) device, etc., and/or at least one volatile memory device such as a dynamic random access memory (DRAM) device, a static random access memory (SRAM) device, a mobile dynamic random access memory (mobile DRAM) device, etc.

The storage device 1330 may be a solid state drive (SSD) device, a hard disk drive (HDD) device, a CD-ROM device, etc. The I/O device 1340 may be an input device such as a keyboard, a keypad, a mouse, a touch screen, etc., and/or an output device such as a printer, a speaker, etc. The power supply 1350 may supply power for operations of the electronic device 1300.

The display device 1360 may include a display unit, a data driver outputting data signals to the display unit, and a scan driver outputting a plurality of scan signals to the display unit. The scan driver may include a plurality of transistors overlapping each other. Accordingly, an area occupied by the scan driver may decrease, and a dead space of the display device 1360 may decrease.

In an embodiment, as illustrated in FIG. 14, the electronic device 1300 may be implemented as a head-mounted display (HMD) 1400. However, the electronic device 1300 according to embodiments may not be limited to the HMD 1400. For example, the electronic device 1300 may be any electronic device including the display device 1360, such as a virtual reality (VR) device, a cellular phone, a smart phone, a tablet computer, a wearable device, a personal digital assistant (PDA), a portable multimedia player (PMP), a digital camera, a music player, a portable game console, a navigation system, a digital television, a 3D television, a personal computer (PC), a home appliance, a laptop computer, etc.

The display device according to the embodiments may be applied to a display device and an electronic device including the same. For example, the display device may be included in a HMD, a VR device, a cellular phone, a smart phone, a tablet computer, a digital TV, a 3D TV, a PC, a home appliance, a laptop computer, a PDA, a PMP, a digital camera, a music player, a portable game console, a navigation system, etc.

Although the scan drivers and the display devices including the scan drivers according to the embodiments have been described with reference to the drawings, the illustrated embodiments are examples, and may be modified and changed by a person having ordinary knowledge in the relevant technical field without departing from the technical spirit described in the following claims, with functional equivalents thereof to be include herein.

What is claimed is:

1. A scan driver, comprising:
   a substrate;
   a first transistor on the substrate, the first transistor comprising a first active pattern and a first gate electrode, the first active pattern comprising a first region, a second region, and a first channel region between the first region and the second region;
   a second transistor on the first transistor, the second transistor comprising a second active pattern and a second gate electrode, the second active pattern comprising a third region, a fourth region, and a second channel region between the third region and the fourth region;
   a first electrode and a second electrode on the second transistor, the first electrode and the second electrode electrically connected to the first region and the second region, respectively; and
   a third electrode and a fourth electrode on the second transistor, the third electrode and the fourth electrode electrically connected to the third region and the fourth region, respectively,
   wherein the first electrode is electrically connected to the third electrode.

2. The scan driver of claim 1, wherein the first active pattern comprises a first overlapping portion, a first protruding portion protruding from the first overlapping portion in a first direction and being connected to the first electrode, and a second protruding portion protruding from the first overlapping portion in a second direction and being connected to the second electrode.

3. The scan driver of claim 2, wherein the second active pattern comprises a second overlapping portion overlapping the first overlapping portion, a third protruding portion protruding from the second overlapping portion in the first direction and being connected to the third electrode, and a fourth protruding portion protruding from the second overlapping portion in the second direction and being connected to the fourth electrode.

4. The scan driver of claim 3, wherein the third protruding portion does not overlap the first protruding portion, and the fourth protruding portion does not overlap the second protruding portion.

5. The scan driver of claim 3, wherein the second direction is opposite to the first direction.

6. The scan driver of claim 1, wherein the second electrode is electrically connected to the fourth electrode.

7. The scan driver of claim 1, wherein the second gate electrode overlaps the first gate electrode.

8. The scan driver of claim 1, further comprising a shielding electrode between the first transistor and the second transistor.

9. The scan driver of claim 8, wherein a width of the shielding electrode is greater than a width of the first gate electrode.

10. The scan driver of claim 8, wherein a voltage for controlling a driving range of the second transistor is applied to the shielding electrode.

11. The scan driver of claim 10, wherein the driving range of the second transistor becomes wide when a negative voltage is applied to the shielding electrode, and becomes narrow when a positive voltage is applied to the shielding electrode.

12. The scan driver of claim 1, further comprising a plurality of stages for outputting a plurality of scan signals, respectively, wherein each of the plurality of stages comprises:
   a first input part for transmitting an input signal to a set node in response to a second clock signal;
   a second input part for transmitting a first clock signal to a reset node in response to the input signal and the second clock signal;
   a first output part for outputting a third clock signal as the scan signal in response to a voltage of the set node; and
   a second output part for outputting a concurrent driving signal as the scan signal in response to a voltage of the reset node.

13. The scan driver of claim 12, wherein the plurality of stages comprise a first stage comprising the first transistor, and a second stage comprising the second transistor.

14. The scan driver of claim 13, wherein the first output part of the first stage comprises the first transistor, and the first output part of the second stage comprises the second transistor.

15. The scan driver of claim 13, wherein the second output part of the first stage comprises the first transistor, and the second output part of the second stage comprises the second transistor.

16. The scan driver of claim 12, wherein the first output part comprises the first transistor, and the second output part comprises the second transistor.

17. A scan driver, comprising:
   a substrate;
   a first active pattern on the substrate, the first active pattern comprising a first region, a second region, and a first channel region between the first region and the second region;
   a first gate electrode on the first active pattern;
   a second active pattern on the first gate electrode, the second active pattern comprising a third region, a fourth region, and a second channel region between the third region and the fourth region;
   a second gate electrode on the second active pattern;
   a first electrode and a second electrode on the second gate electrode, the first electrode and the second electrode being electrically connected to the first region and the second region, respectively; and
   a third electrode and a fourth electrode on a same layer as the first electrode and the second electrode, the third electrode and the fourth electrode being electrically connected to the third region and the fourth region, respectively,
   wherein the first electrode is integrally formed with the third electrode.

18. The scan driver of claim 17, wherein the second electrode is integrally formed with the fourth electrode.

19. The scan driver of claim 17, wherein the first active pattern comprises a first overlapping portion, a first protruding portion protruding from the first overlapping portion in a first direction and being connected to the first electrode, and a second protruding portion protruding from the first overlapping portion in a second direction and being connected to the second electrode.

20. The scan driver of claim 19, wherein the second active pattern comprises a second overlapping portion overlapping the first overlapping portion, a third protruding portion protruding from the second overlapping portion in the first direction and being connected to the third electrode, and a fourth protruding portion protruding from the second overlapping portion in the second direction and being connected to the fourth electrode.

21. The scan driver of claim 20, wherein the third protruding portion does not overlap the first protruding portion, and the fourth protruding portion does not overlap the second protruding portion.

22. The scan driver of claim 17, wherein the second gate electrode overlaps the first gate electrode.

23. The scan driver of claim 17, further comprising a shielding electrode between the first gate electrode and the second active pattern.

24. The scan driver of claim 23, wherein a width of the shielding electrode is greater than a width of the first gate electrode.

25. A display device, comprising:
a display unit comprising:
a driving transistor comprising a driving active pattern and a driving gate electrode; and
a switching transistor above the driving transistor in a thickness direction of the display unit, the switching transistor comprising a switching active pattern and a switching gate electrode; and
a scan driver for supplying a scan signal to the display unit, and comprising:
a first transistor comprising a first active pattern and a first gate electrode, the first active pattern comprising a first region, a second region, and a first channel region between the first region and the second region; and
a second transistor on the first transistor, the second transistor comprising a second active pattern and a second gate electrode, the second active pattern comprising a third region, a fourth region, and a second channel region between the third region and the fourth region.

26. The display device of claim 25, wherein the first active pattern and the first gate electrode of the first transistor are respectively on a same layer as the driving active pattern and the driving gate electrode of the driving transistor.

27. The display device of claim 25, wherein the second active pattern and the second gate electrode of the second transistor are respectively on a same layer as the switching active pattern and the switching gate electrode of the switching transistor.

28. The display device of claim 25, wherein the display unit further comprises a storage capacitor comprising a first storage electrode integrally formed with the driving gate electrode, and a second storage electrode between the driving transistor and the switching transistor, and
wherein the scan driver further comprises a shielding electrode between the first transistor and the second transistor.

29. The display device of claim 28, wherein the shielding electrode is on a same layer as the second storage electrode.

30. The display device of claim 25, wherein the display unit further comprises a program capacitor comprising a first program electrode on the switching transistor, and a second program electrode on the first program electrode, and
wherein the scan driver further comprises a first electrode, a second electrode, a third electrode, and a fourth electrode on the second transistor, the first electrode, the second electrode, the third electrode, and the fourth electrode being electrically connected to the first region, the second region, the third region, and the fourth region, respectively.

31. The display device of claim 30, wherein the first electrode, the second electrode, the third electrode, and the fourth electrode are on a same layer as one of the first program electrode and the second program electrode.

32. The display device of claim 30, further comprising:
a pixel electrode electrically connected to the second program electrode;
an organic light emitting layer on the pixel electrode; and
a common electrode on the organic light emitting layer.

* * * * *